United States Patent
Hagen et al.

[11] Patent Number: 6,100,702
[45] Date of Patent: Aug. 8, 2000

[54] IN-SITU FAULT DETECTION APPARATUS AND METHOD FOR AN ENCASED ENERGY STORING DEVICE

[75] Inventors: Ronald A. Hagen, Stillwater, Minn.; Christophe Comte, Montreal, Canada; Orlin B. Knudson, Vadnais Heights; Brian Rosenthal, Stillwater, both of Minn.; Jean Rouillard, Saint-Luc, Canada

[73] Assignees: 3M Innovative Properties Company, Saint Paul, Minn.; Hydro-Quebec Corporation, Montreal

[21] Appl. No.: 08/900,611

[22] Filed: Jul. 25, 1997

[51] Int. Cl.⁷ .......................... G01R 31/40; G01R 31/12
[52] U.S. Cl. ..................... 324/551; 324/509; 324/771; 324/557
[58] Field of Search .................. 324/509, 522, 324/551, 557, 771

[56] References Cited

U.S. PATENT DOCUMENTS

| | | |
|---|---|---|
| 2,812,376 | 11/1957 | Yardney . |
| 3,193,412 | 7/1965 | Salkind et al. . |
| 3,390,014 | 6/1968 | Eisler . |
| 3,578,506 | 5/1971 | Chassoux . |
| 3,630,783 | 12/1971 | Przybyla .................. 136/107 |
| 3,786,466 | 1/1974 | Naito et al. . |
| 3,793,501 | 2/1974 | Stonestrom . |
| 3,899,355 | 8/1975 | Chiklis . |
| 3,937,635 | 2/1976 | Mead et al. .................. 136/83 R |
| 4,028,479 | 6/1977 | Fanciullo et al. .................. 429/152 |
| 4,060,669 | 11/1977 | Fanciullo .................. 429/152 |
| 4,060,670 | 11/1977 | Tamminen .................. 429/154 |
| 4,080,728 | 3/1978 | Buckler .................. 29/623.4 |
| 4,091,186 | 5/1978 | Ott et al. . |
| 4,098,965 | 7/1978 | Kinsman .................. 429/153 |
| 4,105,807 | 8/1978 | Arora .................. 427/126 |
| 4,137,627 | 2/1979 | Kinsman .................. 29/623.4 |
| 4,150,266 | 4/1979 | Patrichi . |
| 4,152,825 | 5/1979 | Bruneau .................. 29/623.2 |
| 4,207,389 | 6/1980 | Gunther et al. .................. 429/164 |
| 4,209,479 | 6/1980 | Gunther et al. .................. 264/104 |
| 4,233,371 | 11/1980 | Dorrestijn .................. 429/152 |
| 4,238,721 | 12/1980 | DeLuca et al. . |
| 4,241,152 | 12/1980 | Klink . |
| 4,280,097 | 7/1981 | Carey et al. .................. 324/434 |
| 4,303,877 | 12/1981 | Meinhold . |
| 4,321,435 | 3/1982 | Grieger et al. . |

(List continued on next page.)

FOREIGN PATENT DOCUMENTS

| | | |
|---|---|---|
| 044 753 A1 | 1/1982 | European Pat. Off. . |
| 145 498 A2 | 6/1985 | European Pat. Off. . |
| 0 170 883 A1 | 2/1986 | European Pat. Off. . |
| 177 225 A1 | 4/1986 | European Pat. Off. . |
| 0 225 767 A2 | 6/1987 | European Pat. Off. . |

(List continued on next page.)

*Primary Examiner*—Glenn W. Brown
*Attorney, Agent, or Firm*—Altera Law Group LLC

[57] ABSTRACT

An apparatus and method for detecting a breach in an electrically insulating surface of an electrically conductive power system enclosure within which a number of series connected energy storing devices are disposed. The energy storing devices disposed in the enclosure are connected to a series power connection. A detector is coupled to the series connection and detects a change of state in a test signal derived from the series connected energy storing devices. The detector detects a breach in the insulating layer of the enclosure by detecting a state change in the test signal from a nominal state to a non-nominal state. A voltage detector detects a state change of the test signals from a nominal state, represented by a voltage of a selected end energy storing device, to a non-nominal state, represented by a voltage that substantially exceeds the voltage of the selected opposing end energy storing device. Alternatively, the detector may comprise a signal generator that produces the test signal as a time-varying or modulated test signal and injects the test signal into the series connection. The detector detects the state change of the time-varying or modulated test signal from a nominal state, represented by a signal substantially equivalent to the test signal, to a non-nominal state, representative by an absence of the test signal.

20 Claims, 15 Drawing Sheets

U.S. PATENT DOCUMENTS

| | | |
|---|---|---|
| 4,322,484 | 3/1982 | Sugalski . |
| 4,342,978 | 8/1982 | Meister . |
| 4,370,531 | 1/1983 | Tobin . |
| 4,383,013 | 5/1983 | Bindin et al. . |
| 4,409,086 | 10/1983 | Haas et al. . |
| 4,409,538 | 10/1983 | Tabata . |
| 4,429,026 | 1/1984 | Bruder ................................... 429/152 |
| 4,436,792 | 3/1984 | Tomino et al. . |
| 4,477,545 | 10/1984 | Akridge et al. ......................... 429/191 |
| 4,479,083 | 10/1984 | Sullivan . |
| 4,490,707 | 12/1984 | O'Leary . |
| 4,495,259 | 1/1985 | Uba . |
| 4,507,857 | 4/1985 | Epstein et al. ......................... 29/623.2 |
| 4,517,265 | 5/1985 | Belanger et al. . |
| 4,518,665 | 5/1985 | Fujita et al. . |
| 4,525,439 | 6/1985 | Simonton ................................ 429/162 |
| 4,547,438 | 10/1985 | McArthur et al. ........................ 429/82 |
| 4,571,468 | 2/1986 | Weldon . |
| 4,654,278 | 3/1987 | McManis, III et al. . |
| 4,664,993 | 5/1987 | Sturgis et al. .......................... 429/178 |
| 4,670,703 | 6/1987 | Williams . |
| 4,691,085 | 9/1987 | Swanson . |
| 4,692,577 | 9/1987 | Swanson . |
| 4,707,795 | 11/1987 | Alber et al. . |
| 4,752,540 | 6/1988 | Chua et al. .............................. 429/56 |
| 4,758,483 | 7/1988 | Armand et al. . |
| 4,816,354 | 3/1989 | Tamminen ............................ 429/162 |
| 4,824,746 | 4/1989 | Belanger et al. . |
| 4,828,939 | 5/1989 | Turley et al. . |
| 4,851,307 | 7/1989 | Armand et al. . |
| 4,852,684 | 8/1989 | Packard . |
| 4,883,726 | 11/1989 | Peled et al. ............................. 424/120 |
| 4,887,348 | 12/1989 | Tamminen ............................ 29/623.2 |
| 4,897,917 | 2/1990 | Gauthier et al. . |
| 4,911,993 | 3/1990 | Turley et al. ............................. 429/27 |
| 4,913,259 | 4/1990 | Packard . |
| 4,923,582 | 5/1990 | Abrahamson et al. . |
| 4,927,717 | 5/1990 | Turley et al. ............................. 429/27 |
| 4,961,043 | 10/1990 | Koenck . |
| 4,967,136 | 10/1990 | Nofzinger . |
| 4,971,531 | 11/1990 | Aikioniemi . |
| 4,973,936 | 11/1990 | Dimpault-Darcy et al. . |
| 4,997,732 | 3/1991 | Austin et al. ........................... 429/153 |
| 5,008,161 | 4/1991 | Johnston .................................. 429/7 |
| 5,057,385 | 10/1991 | Hope et al. . |
| 5,066,555 | 11/1991 | Tamminen ............................ 429/121 |
| 5,070,787 | 12/1991 | Weldon et al. . |
| 5,071,652 | 12/1991 | Jones et al. . |
| 5,089,027 | 2/1992 | Rossoll et al. ......................... 29/623.2 |
| 5,162,171 | 11/1992 | Jones . |
| 5,180,641 | 1/1993 | Burns et al. . |
| 5,197,889 | 3/1993 | Rizzo et al. . |
| 5,199,239 | 4/1993 | Younger . |
| 5,204,194 | 4/1993 | Miller et al. . |
| 5,227,259 | 7/1993 | Weaver et al. . |
| 5,227,264 | 7/1993 | Duval et al. . |
| 5,283,512 | 2/1994 | Stadnick et al. . |
| 5,300,373 | 4/1994 | Shackle . |
| 5,313,152 | 5/1994 | Wozniak et al. . |
| 5,324,597 | 6/1994 | Leadbetter et al. . |
| 5,337,042 | 8/1994 | Hormel et al. . |
| 5,346,786 | 9/1994 | Hodgetts . |
| 5,354,630 | 10/1994 | Earl et al. . |
| 5,363,405 | 11/1994 | Hormel . |
| 5,382,480 | 1/1995 | Molyneux . |
| 5,384,212 | 1/1995 | Heiman et al. . |
| 5,385,793 | 1/1995 | Tiedemann et al. . |
| 5,393,617 | 2/1995 | Klein . |
| 5,401,595 | 3/1995 | Kagawa et al. . |
| 5,409,787 | 4/1995 | Blanyer et al. . |
| 5,415,954 | 5/1995 | Gauthier et al. . |
| 5,422,200 | 6/1995 | Hope et al. . |
| 5,423,110 | 6/1995 | Gauthier et al. . |
| 5,438,249 | 8/1995 | Chang et al. . |
| 5,478,667 | 12/1995 | Shackle et al. . |
| 5,478,668 | 12/1995 | Gozdz et al. . |
| 5,479,083 | 12/1995 | Brainard . |
| 5,487,958 | 1/1996 | Tura . |
| 5,503,947 | 4/1996 | Kelly et al. . |
| 5,503,948 | 4/1996 | MacKay et al. . |
| 5,504,415 | 4/1996 | Podrazhansky et al. . |
| 5,519,563 | 5/1996 | Higashijimaa et al. . |
| 5,521,024 | 5/1996 | Sasaki et al. . |
| 5,528,122 | 6/1996 | Sullivan et al. . |
| 5,530,336 | 6/1996 | Eguchi et al. . |
| 5,530,363 | 6/1996 | Gaughan et al. ....................... 324/509 |
| 5,532,087 | 7/1996 | Nerz et al. . |
| 5,547,775 | 8/1996 | Eguchi et al. . |
| 5,547,780 | 8/1996 | Kagawa et al. . |
| 5,548,200 | 8/1996 | Nor et al. . |
| 5,552,243 | 9/1996 | Klein . |
| 5,556,576 | 9/1996 | Kim . |
| 5,561,380 | 10/1996 | Sway-Tin et al. . |
| 5,563,002 | 10/1996 | Harshe . |
| 5,567,539 | 10/1996 | Takahashi et al. . |
| 5,568,039 | 10/1996 | Fernandez . |
| 5,569,063 | 10/1996 | Morioka et al. . |
| 5,569,550 | 10/1996 | Garrett et al. . |
| 5,573,869 | 11/1996 | Hwang et al. . |
| 5,582,931 | 12/1996 | Kawakami . |
| 5,585,207 | 12/1996 | Wakabe et al. . |
| 5,589,290 | 12/1996 | Klink et al. . |
| 5,593,604 | 1/1997 | Beasly et al. . |
| 5,594,320 | 1/1997 | Pacholok et al. . |
| 5,595,835 | 1/1997 | Miyamoto et al. . |
| 5,595,839 | 1/1997 | Hossain . |
| 5,599,636 | 2/1997 | Braun . |
| 5,600,230 | 2/1997 | Dunstan . |
| 5,602,481 | 2/1997 | Fukuyama . |
| 5,610,495 | 3/1997 | Yee et al. . |
| 5,612,153 | 3/1997 | Moulton et al. . |
| 5,618,641 | 4/1997 | Arias . |
| 5,619,417 | 4/1997 | Kendall . |
| 5,620,808 | 4/1997 | Wheeler et al. . |
| 5,622,789 | 4/1997 | Young . |
| 5,623,196 | 4/1997 | Fernandez et al. . |
| 5,626,990 | 5/1997 | Miller et al. . |
| 5,631,537 | 5/1997 | Armstrong . |
| 5,633,573 | 5/1997 | van Phuoc et al. . |
| 5,637,981 | 6/1997 | Nagai et al. . |
| 5,643,044 | 7/1997 | Lund . |
| 5,647,531 | 7/1997 | Kelz et al. . |
| 5,648,713 | 7/1997 | Mangez . |
| 5,650,240 | 7/1997 | Rogers . |
| 5,652,498 | 7/1997 | Edye et al. . |
| 5,652,502 | 7/1997 | van Phuoc et al. . |
| 5,654,622 | 8/1997 | Toya et al. . |
| 5,670,272 | 9/1997 | Cheu et al. ............................. 429/162 |
| 5,824,432 | 10/1998 | Currle . |

FOREIGN PATENT DOCUMENTS

| | | |
|---|---|---|
| 244 683 A1 | 11/1987 | European Pat. Off. . |
| 310 075 A2 | 4/1989 | European Pat. Off. . |
| 336 102 A2 | 10/1989 | European Pat. Off. . |
| 569 035 A1 | 11/1993 | European Pat. Off. . |
| 570 590 A1 | 11/1993 | European Pat. Off. . |
| 584 639 A1 | 3/1994 | European Pat. Off. . |
| 0 605 997 A1 | 7/1994 | European Pat. Off. . |
| 643 429 A2 | 3/1995 | European Pat. Off. . |
| 652 620 A1 | 5/1995 | European Pat. Off. . |
| 700 109 A1 | 3/1996 | European Pat. Off. . |
| 0 721 247 A2 | 7/1996 | European Pat. Off. . |

| | | | | | |
|---|---|---|---|---|---|
| 0 751 396 A1 | 1/1997 | European Pat. Off. . | 6-203823 | 7/1994 | Japan . |
| 774 795 A2 | 5/1997 | European Pat. Off. . | 07250788 | 10/1995 | Japan . |
| 780 920 A1 | 6/1997 | European Pat. Off. . | 07282841 | 10/1995 | Japan . |
| 2 435 043 | 4/1980 | France . | 08115711 | 5/1996 | Japan . |
| 2 511 547 | 2/1983 | France . | 9-017416 | 1/1997 | Japan . |
| 2 721 407 | 12/1995 | France . | 1066-385 | 6/1986 | Russian Federation . |
| 3246968 A1 | 7/1984 | Germany . | 1582979 | 1/1981 | United Kingdom . |
| 279 958 A1 | 6/1990 | Germany . | 2 206 726 | 1/1989 | United Kingdom . |
| 4218381 C1 | 5/1993 | Germany . | 2 282 924 | 4/1995 | United Kingdom . |
| 42 25 746 A1 | 2/1994 | Germany . | 2295718 | 6/1996 | United Kingdom . |
| 94 15 874 U | 12/1994 | Germany . | WO 91/17451 | 11/1991 | WIPO . |
| 19618897 A1 | 11/1997 | Germany . | WO 92/02963 | 2/1992 | WIPO . |
| 59-091658 | 5/1984 | Japan . | WO 93/01624 | 1/1993 | WIPO . |
| 59-117061 | 7/1984 | Japan . | WO 94/14206 | 6/1994 | WIPO . |
| 59-139555 | 8/1984 | Japan . | WO 95/00978 | 1/1995 | WIPO . |
| 61-099278 | 5/1986 | Japan . | WO 95/26055 | 9/1995 | WIPO . |
| 63-062156 | 3/1988 | Japan . | WO 95/34824 | 12/1995 | WIPO . |
| 01320758 | 12/1989 | Japan . | WO 96/17397 | 6/1996 | WIPO . |
| 04294071 | 10/1992 | Japan . | WO 96/19816 | 6/1996 | WIPO . |
| 05166533 | 7/1993 | Japan . | WO 96/22523 | 7/1996 | WIPO . |
| 6-036756 | 2/1994 | Japan . | WO 98/11620 | 3/1998 | WIPO . |

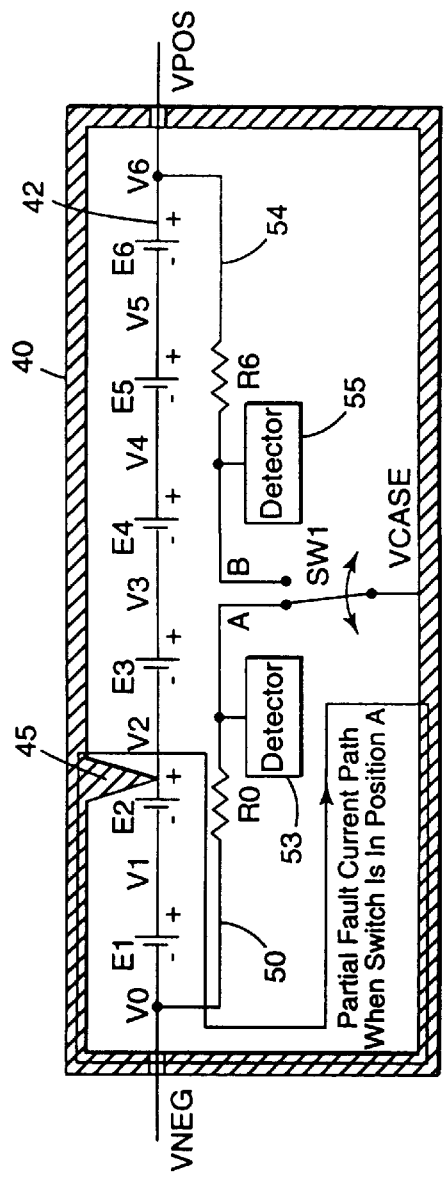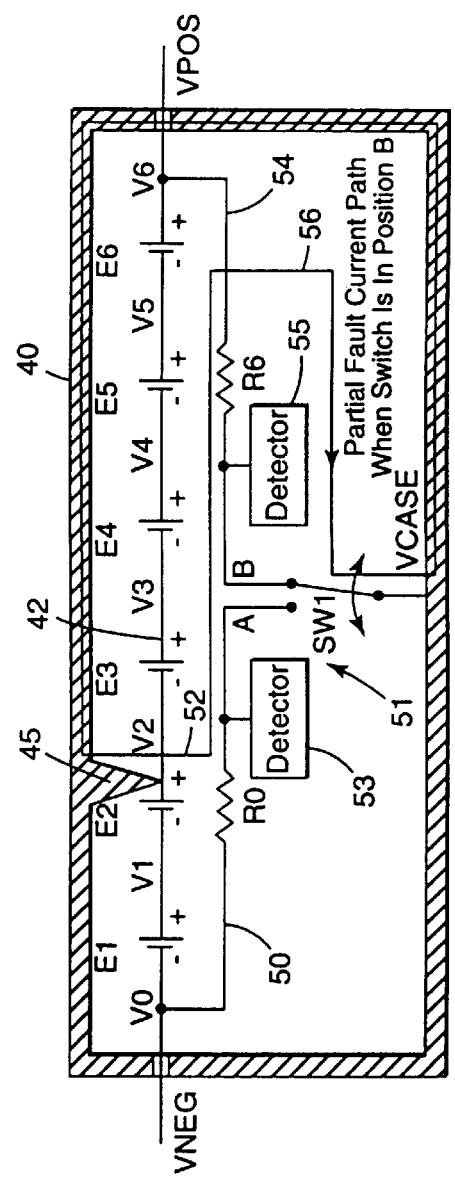

IN-SITU FAULT DETECTION APPARATUS AND METHOD FOR AN ENCASED ENERGY STORING DEVICE

GOVERNMENT LICENSE RIGHTS

The Government of the United States of America has rights in this invention pursuant to Cooperative Agreement No. DE-FC02-91CE50336 awarded by the U.S. Department of Energy.

FIELD OF THE INVENTION

This invention relates generally to energy storing devices, and more particularly, to an in-situ apparatus and method for detecting partial and full short-circuit faults that may develop within an encased energy storing device.

BACKGROUND OF THE INVENTION

A number of advanced energy storing device technologies have recently been developed, such as metal hydride (e.g., Ni—MH), lithium-ion, and lithium polymer cell technologies, which promise to provide high energy generation for a wide range of commercial and consumer applications. In high-energy applications, a substantial number of individual energy storing devices or systems are typically connected in series to produce a requisite amount of electrical power. By way of example, it is believed that a battery system suitable for powering an electric vehicle will likely have a voltage rating on the order of several hundred volts, and a current rating on the order of several hundred amperes.

In applications in which such energy storing devices are encased in an electrically conductive enclosure or housing, it is considered desirable to electrically isolate the energy storing devices from the enclosure. It is known, for example, that the development of a low resistivity current path or short between an energy storing device and a protective enclosure generally leads to the progressive degradation of the energy storing device over time.

In the case of a partial fault, a single breach or short develops in an insulation layer separating the enclosure walls from the energy storing devices. As a result, the enclosure becomes energized to a potential equal to that of a junction within the series connected energy storing devices where the breach developed. If detected at an early stage, the defect may be repaired. If left undetected, a low impedance current path may further degrade into a full short-circuit condition, and, more concerning, additional low resistivity current paths may also develop. In the case of a full fault, two or more low impedance paths between the energy storing devices and the enclosure develop due to degradation in the insulation layer. A full fault condition results in the production of a dangerous and potentially catastrophic circulating current within the enclosure.

Single and multiple internal shorts that develop between a protective housing and one or more energy storing devices encased therein are often undetectable when measuring the potential across the housing terminals or the current produced by the energy storing devices. The effect of a partial or even a full fault condition on the potential and current flow of an energy storing device or system is often minimal during the early service life of the energy storing system. If such internal faults remain undetected, however, the overall service life of the energy storing system may be significantly reduced, and unexpected and potentially violent failure of the power system may occur without warning.

There is a need in the battery manufacturing industry for an apparatus and method for effectively detecting the presence of internal short-circuit conditions arising in an encased energy storing system. There exists a further need for such an implementation which is also capable of identifying which of several series connected independent energy storing systems have been subject to an internal short-circuit condition. The present invention fulfills these and other needs.

SUMMARY OF THE INVENTION

The present invention is directed to an apparatus and method for detecting a breach in an electrically resistive surface of an electrically conductive power system enclosure within which a number of series connected energy storing devices are disposed. The energy storing devices disposed in the enclosure are connected to a series power connection. A detector is coupled to the series connection and detects a change of state in a test signal derived from the series connected energy storing devices. The detector detects the presence of a breach in the insulating layer of the enclosure by detecting a state change in the test signal from a nominal state to a non-nominal state.

In one embodiment, the detector comprises a pair of tap lines respectively coupled to adjacent opposing end energy storing devices of the series connected energy storing devices. A switch provides selective connectivity between each of the tap lines and the enclosure for the purpose of developing a test signal respectively on each of the tap lines. A voltage detector detects a state change of the test signals on the tap lines from a nominal state, represented by a voltage equivalent to that of a selected end energy storing device, to a non-nominal state, represented by a voltage that substantially exceeds the voltage of the selected opposing end energy storing device.

In an alternative embodiment, the detector comprises a signal generator that produces the test signal as a time-varying or modulated test signal and injects the test signal into the series connection. The detector detects a state change or variation in signal strength of the time-varying or modulated test signal from a nominal state to a non-nominal state. In this embodiment, a nominal state is characterized as a detected signal having characteristics substantially equivalent to the test signal, and a non-nominal state is characterized by detecting an absence of the test signal.

BRIEF DESCRIPTION OF THE DRAWINGS

FIGS. 2–8 illustrate an embodiment of a detection apparatus for detecting an internal short in an encased energy storing device using a direct current (DC) approach;

DETAILED DESCRIPTION OF THE EMBODIMENTS

Figure 1:
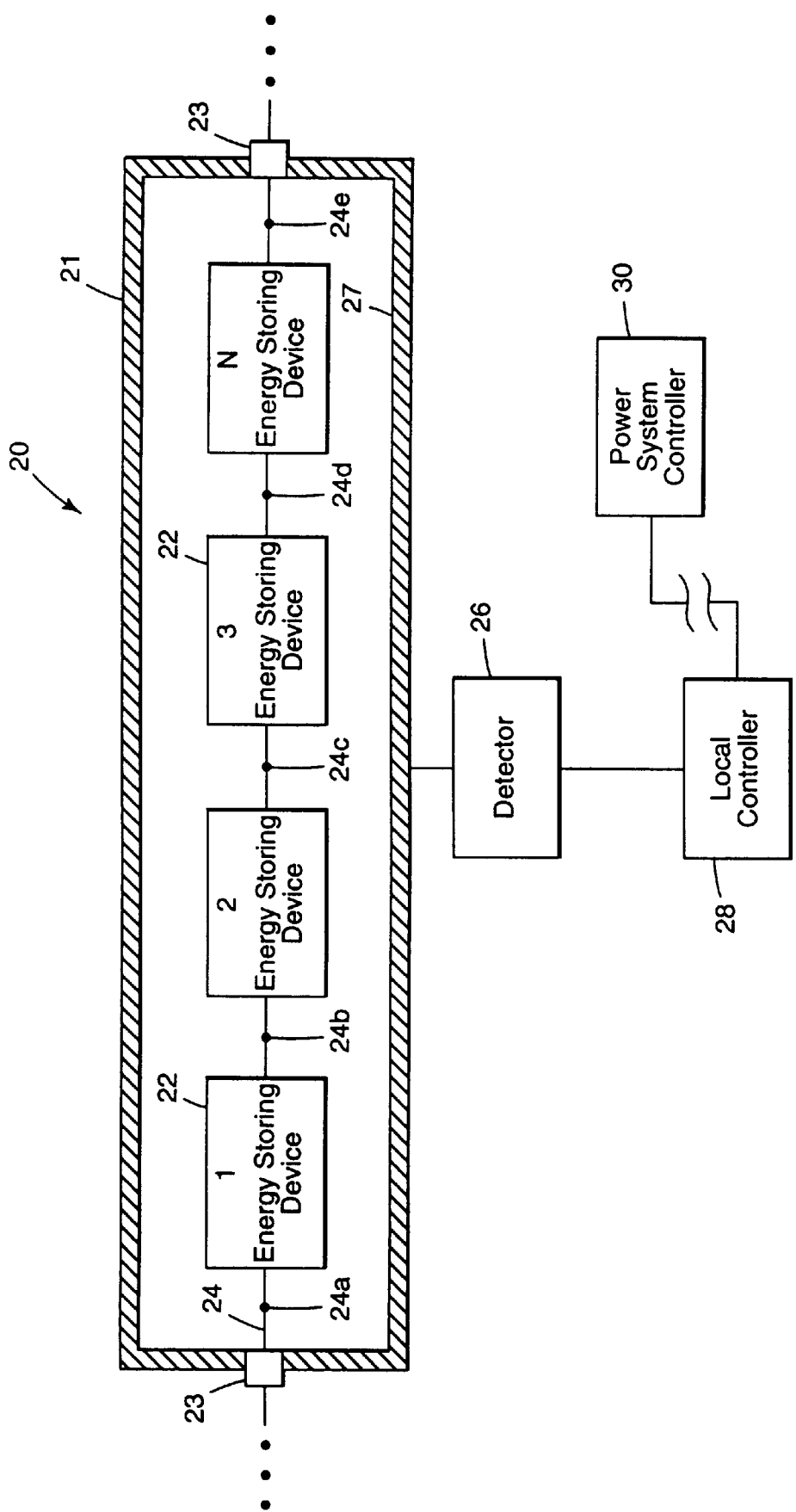
FIG. 1 is a depiction of an embodiment of an apparatus for detecting an internal short in an encased energy storing device.

Referring now to the drawings, and more particularly to FIG. 1, there is illustrated an embodiment of a fault detection apparatus for use with an encased energy storing system 20. In this illustrative embodiment, the energy generating system 20 includes a number of energy storing devices 22 connected in series to a series connection 24 constituted by a number of series nodes or junctions, such as nodes 24*a*–24*e*. The series connected energy storing devices 22 are housed in a protective enclosure 21 which includes a pair of end terminals 23 for connecting the series string of devices 22 to a power consuming device. A detector 26 is coupled to the energy storing system 20 and detects the presence of a current flow path which may develop as a result of a breach in an electrically insulating material or surface 27 disposed between the electrically conductive enclosure 21 and the series nodes 24*a*–24*e* constituting the series connection 24.

In a series connected energy storing system 20, such as that illustrated in FIG. 1, degradation of an insulating material or surface 27 disposed between the series nodes 24*a*–24*e* and an electrically conductive housing 21 may result in the development of one or more low resistivity current paths between the series nodes and the conductive housing 21. In many energy storing system configurations, the presence of a short-circuit current path (e.g., partial fault or full fault) arising through a breach in the housing insulation material 27 is often undetectable when employing a conventional external power monitoring scheme.

If a single low resistivity breach or partial fault develops between the node 24*b* and the conductive housing 21, for example, the housing 21 will be energized to a potential equal to that of node 24*b* (i.e., $V_{24b}$) if the housing ground is floating. Alternatively, the housing 21 is energized to the potential across the power terminals 23 if the housing 21 is fixed at a given potential. Although a partial fault condition typically results in energizing the electrically conductive housing 21 to a given potential, partial faults generally do not result in an appreciable or detectable change in the terminal-to-terminal potential of the energy storing system 20.

Although a partial fault does not necessarily reduce the output current or terminal potential of an energy storing system 20, it is believed that a partial fault condition typically represents a precursor event to a failure condition which could result in a reduction in terminal potential. For example, the development of two or more low resistivity breaches in the insulation between the series nodes 24*a*–24*e* and the housing 21 results in the development of a dangerous circulating current through the housing 21, which constitutes a full fault condition. For example, an insulation breach arising between node 24*c* and the housing 21 may cooperate with a subsequently formed insulation breach between node 24*e* and the housing 21 to form a short-circuit current path therebetween.

The magnitude of the circulating current flowing through the housing 21 via nodes 24*c*, 24*e* is dependent on the contact resistance of the breaches at the nodes 24*c*, 24*e* and the internal impedances of the affected energy storing devices 22. If the contact resistance is low, the magnitude of the short-circuit current may be significant. In this case, the full fault condition results in the wasteful expenditure of energy in the form of circulating current rather than current delivered through the power terminals 23.

The presence of a circulating current resulting from a full fault may be indirectly detected as an increase in power system temperature and, if sufficiently pronounced, may be detected as a decrease in power system potential. In the case of an electrically noisy environment, however, any drop in power terminal potential will be difficult to detect and may be masked by internal system interference. As such, the presence of a full fault condition within the power system may not be detected using conventional techniques prior to the failure condition reaching a dangerous and potentially catastrophic level, at which time a pronounced change in power terminal voltage may be detected.

The fault detection methodology in accordance with the present invention detects the occurrence of a partial fault condition, which would otherwise go undetected if a conventional external potential measuring technique is employed. Such advanced warning to a possible full fault condition provides a greater time margin within which the system can respond, or take appropriate corrective actions, to an impending full fault condition. Early detection of a partial fault and remedying of the partial fault condition will preclude the occurrence of a dangerous full fault condition.

In one embodiment, the enclosure 21 includes an electrically resistive material 27 developed on an inner surface of the enclosure 21 which electrically insulates the series string of energy storing devices 22 from the electrically conductive enclosure 21. Upon detecting a breach developing in the insulating layer 27 such that a short-circuit current passes from a series node to the enclosure 21, the fault detector 26 produces a fault signal which may be communicated to a local controller 28. The local controller 28 may be disposed within the enclosure 21 or may reside on a control board separate from the enclosure 21.

Depending on the magnitude of the fault condition detected by the fault detector 26, the local controller 28 may report the presence of the fault condition to a power system controller 30 which may communicate with local controllers 28 of a number of energy storing systems 20. The local controller 28 may simply report or log the fault condition, or may take corrective action in response to receiving a fault signal from the fault detector 26. For example, the local controller 28 may send a signal to an annunciator, such as a display on a vehicle control panel, which communicates to a user or technician that service is required.

Figure 2:
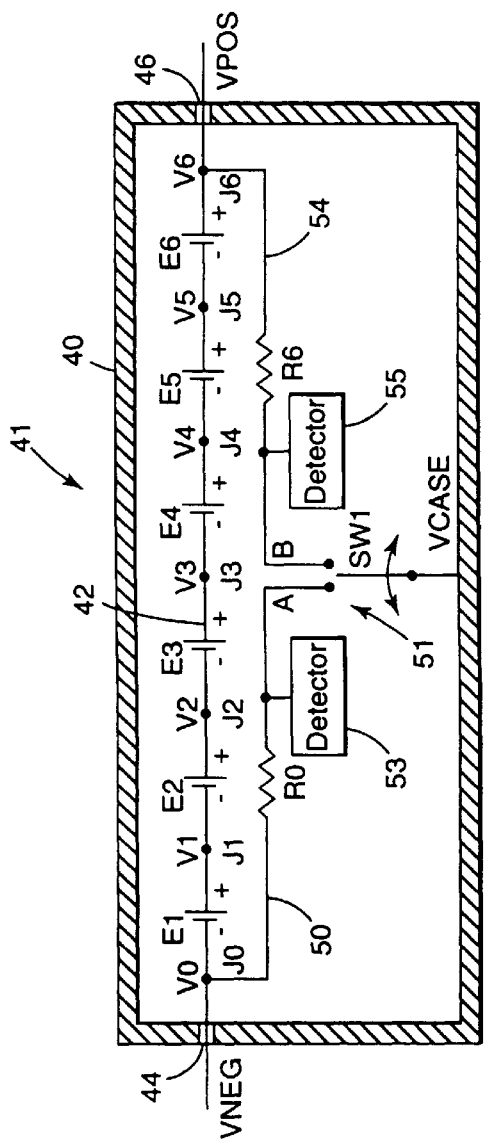
Figure 3:
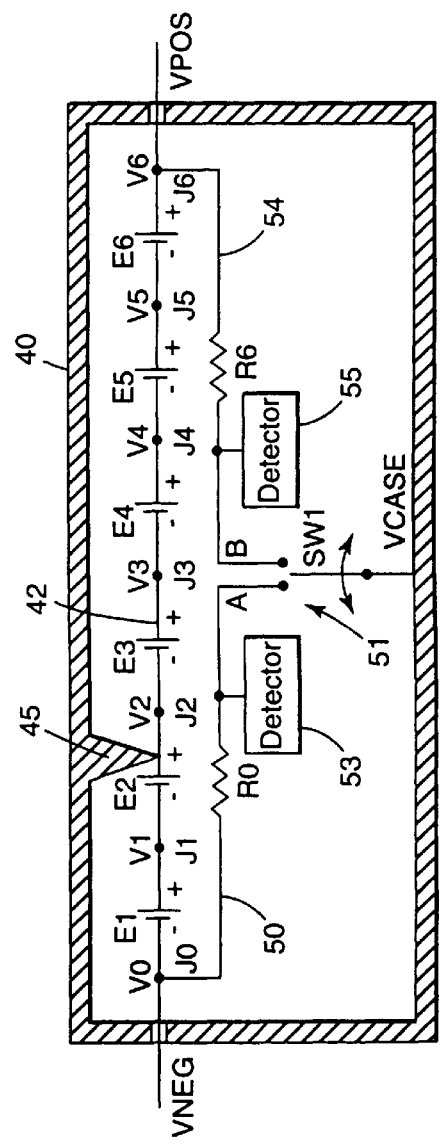

In FIGS. 2–8, there is illustrated an embodiment of a partial fault detection apparatus that implements a direct current detection technique for use with an encased energy storing device. As is shown in FIG. 2, a number of energy storing devices are enclosed within a protective housing 40 and connected together to form a multiple node series connection 42. The housing 40 is fabricated from electrically conductive material, such as aluminum, and includes an electrically resistive interior surface, such as an anodized surface or a sheet of insulating material disposed thereon. The housing 40 includes positive and negative insulated feed-throughs 44, 46 through which current is passed into and out of the housing 40.

In accordance with this embodiment, a fault detection circuit 51 is coupled to a first and a last energy storing device of a series string of energy storing devices. The fault detection circuit 51 includes a switch $SW_1$ which may be actuated to selectively couple the circuit 51 to outermost junctions $J_0$, $J_6$ of the series connection 42, respectively. The switch $SW_1$ is also coupled to the electrically conductive housing 40.

A tap line 50 couples a first terminal, terminal A, of the switch $SW_1$ to the negative terminal 44 or junction $J_0$ of the energy storing system 41. The negative terminal 44 is depicted as having a potential of $V_{NEG}$ or $V_0$. It can be seen that the potential $V_0$ at junction $J_0$ is equivalent to the potential of the negative terminal 44, $V_{NEG}$. The tap line 50 has associated with it an impedance which, in this illustration, is represented as a series resistor, $R_0$. A second tap line 54 couples a second terminal, terminal B, of the switch $SW_1$ to the positive terminal 46 or junction $J_6$ of the energy storing system 41. In this illustration, and under nominal conditions, the tap line 54 has a potential of $V_{POS}$ which is equivalent to that of junction $J_6$. The tap line 54 is shown as having an internal impedance represented by the series resistor $R_6$.

The switch $SW_1$ is switched between terminals A and B and a neutral position so as to selectively connect the tap lines 50, 54 of the fault detection circuit 51 with the housing 40. When testing of a particular power source is not desired, the switch $SW_1$ is set to a neutral position which provides for the testing of a number of other power sources. It is noted that the potential of the junction where the switch $SW_1$ is connected to the housing 40 is given by the potential $V_{CASE}$. It is further noted that the switch $SW_1$ is depicted as a single pole, double throw switch, but may alternatively constitute two single pole, single throw switches or other switch configuration. The switch $SW_1$ may be controlled by a micro-controller or other control device, such as an astable multivibrator, for selectively connecting the tap lines 50, 54 of the fault detection circuit 51 to the housing 40. It is understood that other control devices may be employed to control the actuation of the switch $SW_1$.

Under nominal conditions, the housing 41 has a ground that floats and typically equalizes at a given potential through a high impedance leakage path associated with the series string of energy storing devices 42. When the switch $SW_1$ is actuated to contact terminal A, the potential of the housing, $V_{CASE}$, quickly equilibrates at the potential $V_0$. In a similar manner, when the switch $SW_1$ is actuated so as to contact terminal B, the housing potential, $V_{CASE}$, quickly equilibrates at the potential $V_6$. It is noted that the leakage resistance of the series string of energy storing devices 42 is generally much greater than the impedances, $R_0$, $R_6$, of the tap lines 50, 54.

In the event that a breach develops in the insulating surface or material between the series string of energy storing devices 42 and the housing 40, the potential of the housing 40, $V_{CASE}$, will quickly equilibrate to a potential corresponding to the potential of the junction of the series string 42 at which the breach occurred. For example, and with reference to FIG. 3, a breach in the insulating material between the housing 40 and the series string 42 is depicted as a short 45. The short 45 is shown as having developed at junction $J_2$ between the energy storing device $E_2$ and the energy storing device $E_3$ and has a potential of $V_2$. The break in the insulation layer causes the housing 40 to become energized to the combined potentials of energy storing devices $E_1$ and $E_2$ (i.e., $E_1+E_2$).

In general, if a breach in the insulation material occurs at junctions along the series connection 42 having potentials of $V_1$, $V_2$, $V_3$, $V_4$, $V_5$, or $V_6$ (i.e., other than a junction having a potential of $V_0$), a path for conducting short-circuit current through the tap line 50 is established when switch $SW_1$ is in contact with terminal A. As is shown in FIG. 4, a short-circuit current flow path 52 is established at a junction having a potential of $V_2$, and short-circuit circulating current flows from the series string junction where the breach developed, through the resistor $R_0$ of tap line 50 and switch $SW_1$, and returns through the electrically conductive housing 40. The particular location of the insulation breach, and therefore the location of the insulation breach and short 45, may be determined by calculating the amount of current flowing through the resistor $R_0$ or the voltage developed across the resistor $R_0$. A detector 53, which may detect current or voltage, detects the presence of a current or voltage signal on tap line 50, which may be viewed as a test signal, and determines the magnitude of the test signal. A detector 55, which may detect current or voltage, detects the presence of a current or voltage signal on tap line 54, and determines the magnitude of this test signal.

By application of Ohm's Law, the current flowing through the resistor $R_0$ may be determined by summing the potential across the resistor $R_0$, and dividing this potential value by the resistance value of the resistor $R_0$ (i.e., test current $I_T=(E_1+E_2)/R_0$ or $V_{R0}/R_0$). It is assumed that the nominal operating voltage of individual energy storing devices coupled to the series connection 42 are substantially equivalent. If a test current, $I_T$, is detected passing through tap line 50, for example, the relative location of the short 45 may be indirectly determined by first computing the potential of the junction at which the short 45 occurred. The potential may be determined by dividing the test current, $I_T$, by the value of the resistor $R_0$ (i.e., $V_X=I_T/R_0$). Having determined the magnitude of the junction potential, the location of the short-circuit junction may be determined by comparing the computed potential, $V_X$, with the summation of known voltages, $V_{SUM}$, of individual energy storing devices progressing from the negative terminal 44 to the positive terminal 46. When the value of $V_{SUM}$ exceeds the computed potential, $V_X$, by approximately the amount of potential associated with a single energy storing device, the junction at which the breach developed is located between the previous two energy storing devices.

In an embodiment in which it is desirable to directly determine the junction at which at a short 45 develops, a voltage detector may be coupled in parallel with each of the energy storing devices within the series connection 42. The voltage detector 47 may be coupled to a local controller or an external controller, which acquires voltage level information from each of the voltage detectors coupled to corresponding energy storing devices. A method of determining the short-circuit junction may be determined in a manner similar to that described above and by using the voltage level information acquired for each of the energy storing devices in the series string 42.

When the switch $SW_1$ is actuated to contact terminal B, and as illustrated in FIG. 5, the short-circuit current flow passing through the insulation breach is redirected so as to pass through tap line 54. Under a nominal non-fault condition with the switch $SW_1$ contacting terminal B, the housing potential, $V_{CASE}$, would be brought to the potential $V_6$ through the resistor $R_6$, and as such, no current would flow through the tap line 54. Under a partial fault condition arising upon development of a short 45 to the housing 40 at a junction having a potential of $V_2$, the potential across the resistor $R_6$, and thus the potential of the housing $V_{CASE}$, is given by: $V_{CASE}=(E_6+E_5+E_4+E_3)/R_6$.

Figure 6:
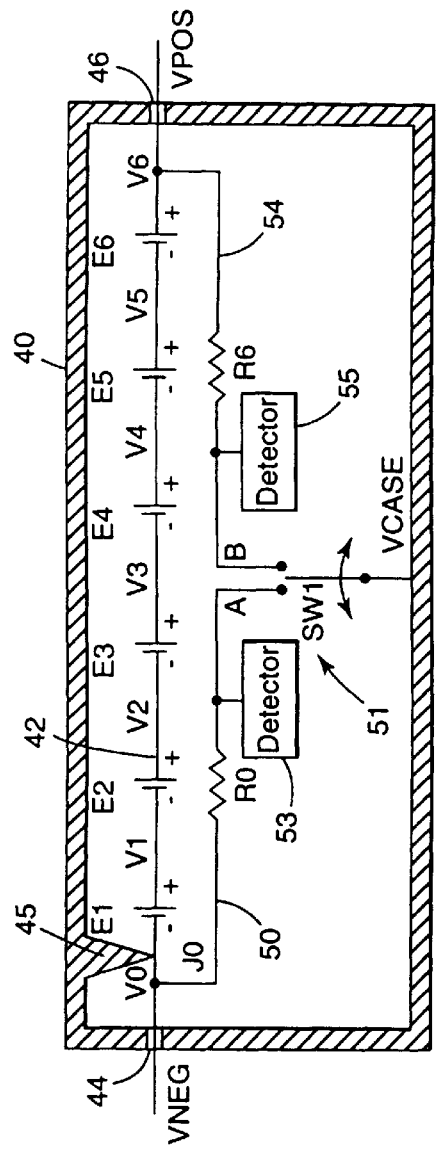
Figure 7:
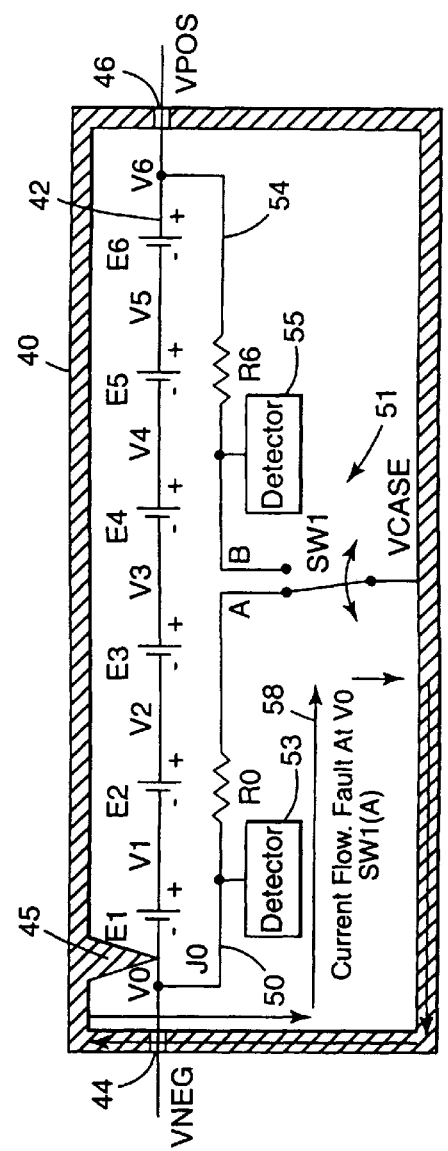
Figure 8:
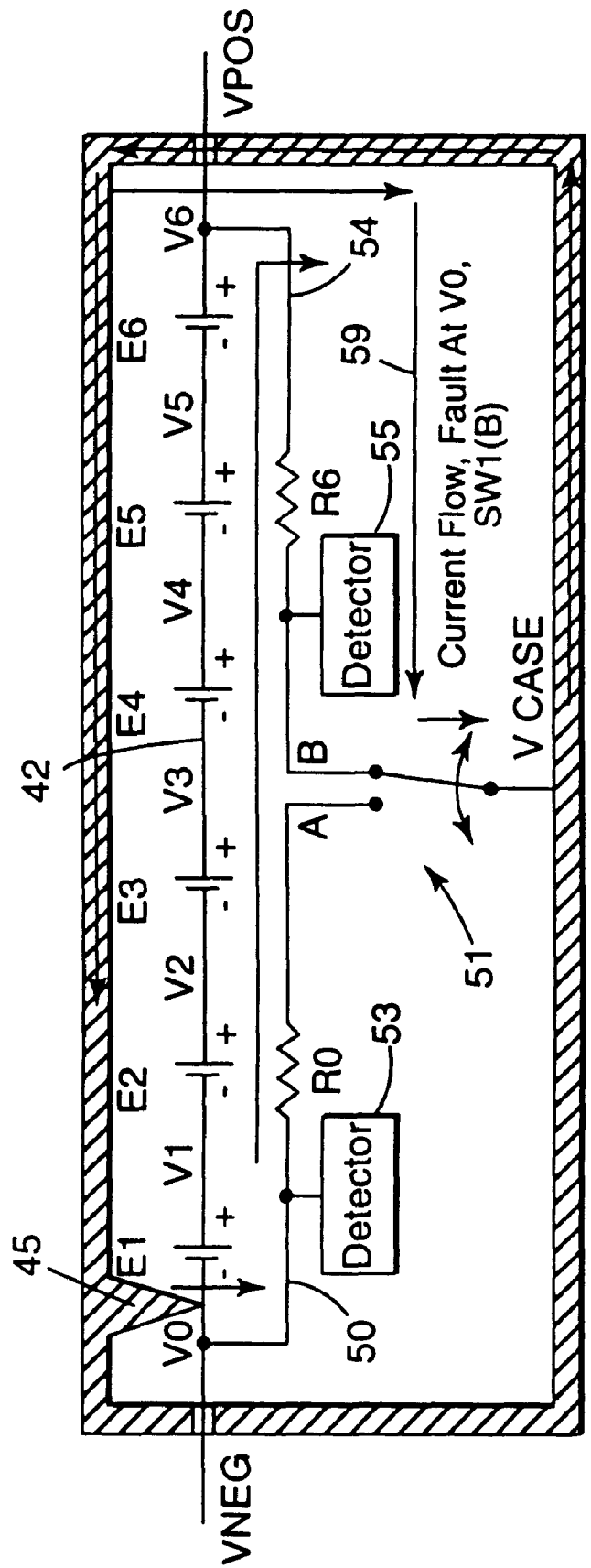

The inclusion of the two tap lines 50, 54 which are selectively activated by actuating switch $SW_1$ between terminals A and B, respectively, is particularly advantageous when detecting and verifying the presence of a short-circuit condition occurring between the end terminals 44, 46 and respective first and last energy storing devices $E_1$ and $E_6$. With reference to FIGS. 6–8, a short 45 is depicted as having developed at a junction $J_0$ between the negative terminal 44 and the first energy storing device, $E_1$. Upon the development of the short 45, the potential of the housing 40 is driven to the potential $V_0$ of the junction $J_0$. Because the potential developed across the resistor $R_0$ of the tap line 50 is also at the potential $V_0$ when the switch $SW_1$ is switched to establish contact with terminal A, the potential across the resistor $R_0$ is equivalent to the housing potential $V_0$, thus erroneously indicating a no-fault condition.

Detecting the presence or absence of a short 45 along the junction having a potential of $V_0$ is therefore not possible through use of the tap line 50 connected to the series connection 42 in the manner shown in FIGS. 2–8. By actuating the switch $SW_1$ to establish contact with terminal B so as to activate the tap line 54, a single fault or breach in the insulating layer between the negative terminal 44 and energy storing device $E_1$ can reliably and accurately be detected. For example, toggling the switch $SW_1$ to contact terminal B, as shown in FIG. 8, permits the detection of a short-circuit current passing through the tap line 54 and resistor $R_6$. It can be seen that the magnitude of the current flowing through the short-circuit flux path 59 is given by: $I_T = (E_1 + E_2 + E_3 + E_4 + E_5 + E_6)/R_6$.

By toggling the switch $SW_1$ between terminals A and B, partial faults can be detected at all junctions within the series connection 42, including those associated with the first and last energy storing devices of the series string 42. Further, the magnitude of the short-circuit current flowing through a breach in the insulating layer between the applicable junction and the housing enclosure may also be determined, giving an indication of the location and magnitude of the breach. Moreover, the location of the short-circuit condition, and an identification of the energy storing devices affected by the short, may also be determined using the above-described DC partial fault detection methodology.

Figure 9:
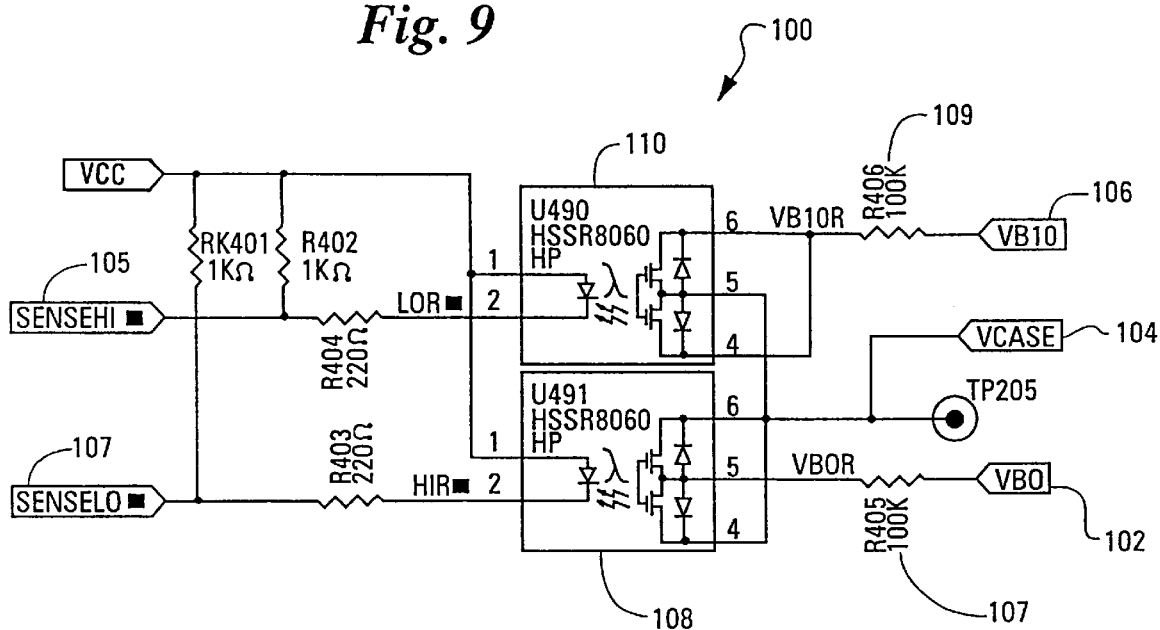
FIGS. 9–11 illustrate in schematic form another embodiment of a DC internal short detection apparatus.
Figure 10:
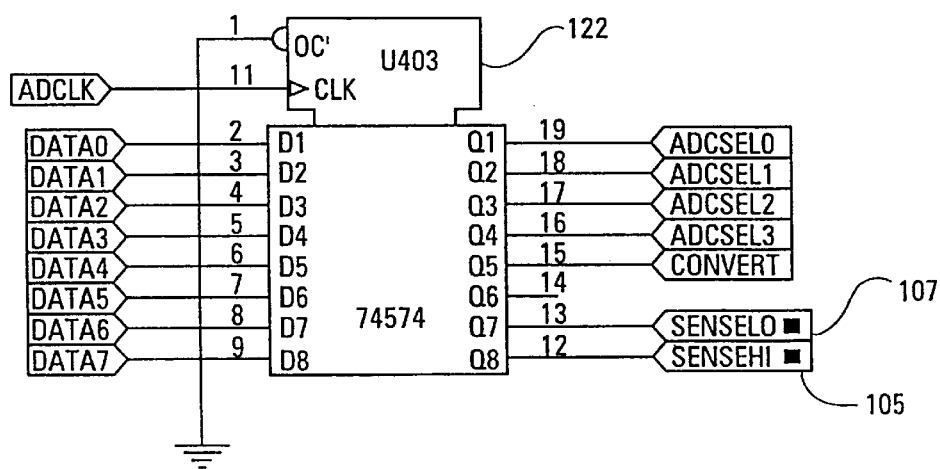
Figure 11:
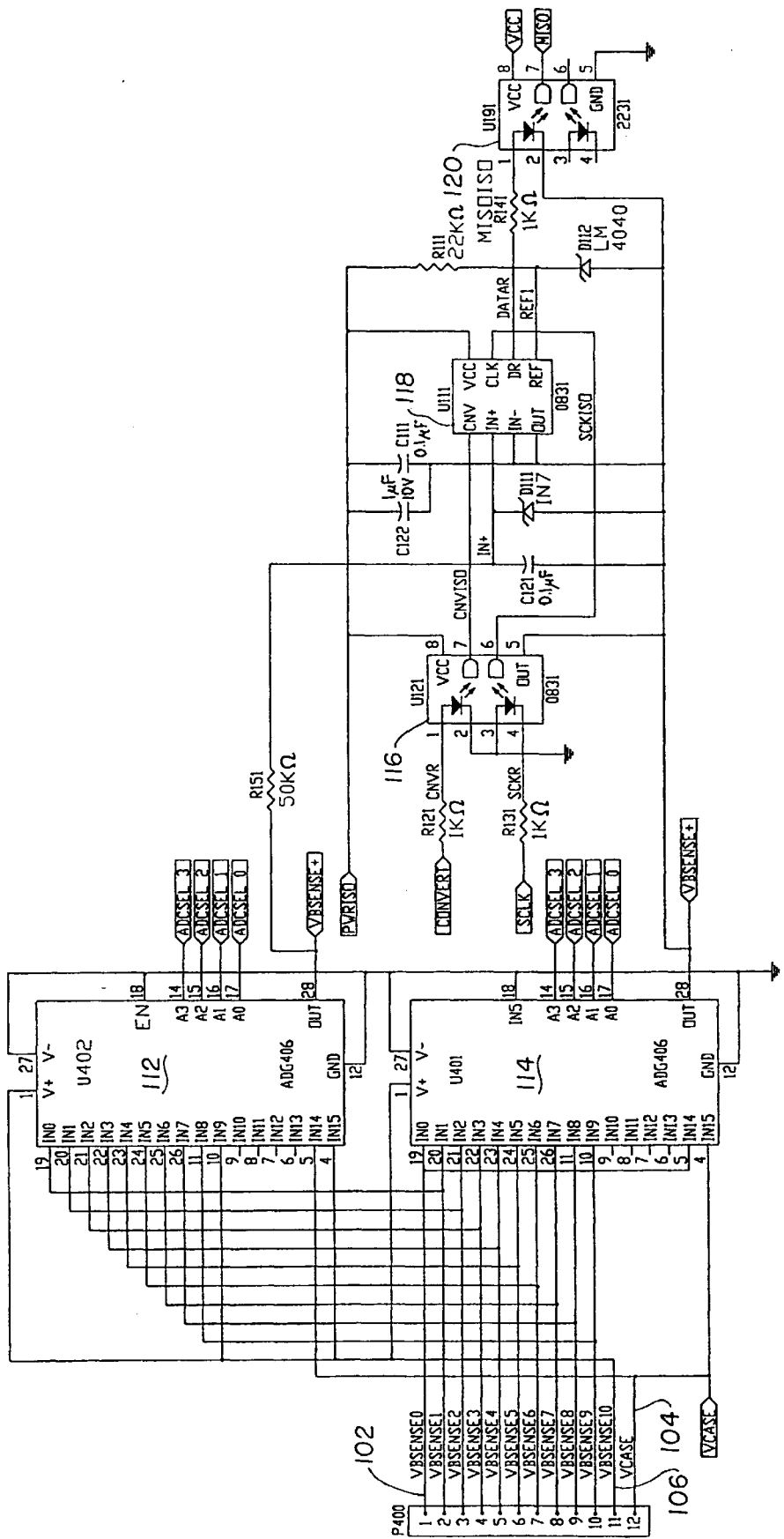

Referring now to FIGS. 9–11, there is illustrated in schematic form another embodiment of a DC detection circuit particularly well-suited for detecting the presence of a partial fault developing along a series string of high-output energy storing devices, such as high-energy solid-state batteries. The detection circuit 100 may be employed to implement the following partial fault detection methodology in accordance with one embodiment of the present invention. Initially, the electrically conductive housing, such as a battery case, within which the series connected energy storing devices are encased, is resistively charged using a solid-state relays or analog switches 108 and a resistor 107 to a potential, $V_{NEG}$, of the energy storing device having the lowest potential within the series string. The sensed potential, $V_{NEG}$, is available at the node VB0 102.

The potential of the housing, $V_{CASE}$, which is available at the node $V_{CASE}$ 104, is then measured with respect to the potential, $V_{NEG}$, at the node VB0 102. Analog switches 112, 114 direct the voltage signals $V_{NEG}$ and $V_{CASE}$ to the analog-to-digital (A/D) convertor 118. The A/D convertor 118 converts the analog voltage difference between $V_{NEG}$ and $V_{CASE}$ to a corresponding digital voltage signal, which may be determined using software executed by a controller. Under nominal non-fault conditions,. the measured signal should have a value of substantially 0 V, ± a voltage tolerance, such as approximately 0.1 V.

Subsequently, the power system housing is resistively charged using the analog switch 110 and a resistor 109 to a potential, $V_{POS}$, of the energy storing device having the highest potential within the series string. The sensed potential, $V_{POS}$, is available at the node VB10 106. The housing potential, $V_{CASE}$, which is available at the node $V_{CASE}$ 104, is then measured, and analog switches 112, 114 direct the two voltage signals $V_{POS}$ and $V_{CASE}$ to the A/D convertor 118. Under nominal non-fault conditions, the measured signal should also have a value of substantially 0 V, ± the voltage tolerance. It is noted that the magnitude of the voltage tolerance should be sufficient to accommodate noise and calibration errors.

A partial fault developing at any junction or node in the series string of energy storing devices will be detected by the fault detection circuit 100 as a measured signal that exceeds a voltage threshold (i.e., 0 V ± the voltage tolerance). For example, the presence of a typical partial fault condition would be detected as a measured signal that exceeds 2 V. In one embodiment, a voltage detector is provided for detecting the voltage of individual energy storing devices in the series string, and a register 122 cooperates with an internal or external controller (not shown) to effect switching between individual energy storing device voltage detectors and the housing voltage detector. As such, each of the energy storing devices is periodically subject to the above-described fault detection procedure to provide continuous monitoring of the series string of energy storing devices.

It is understood that the controller or processor executes software which provides the opportunity to modify the manner in which partial fault detection is performed to accommodate the particular requirements of a give power system configuration. It is noted that components 120 and 116 represent opto-isolators which output and receive signals respectively to and from a micro-controller. It is further noted that data and clock signals received from the component 122 shown in FIG. 10 are received from the microcontroller.

Figure 12:
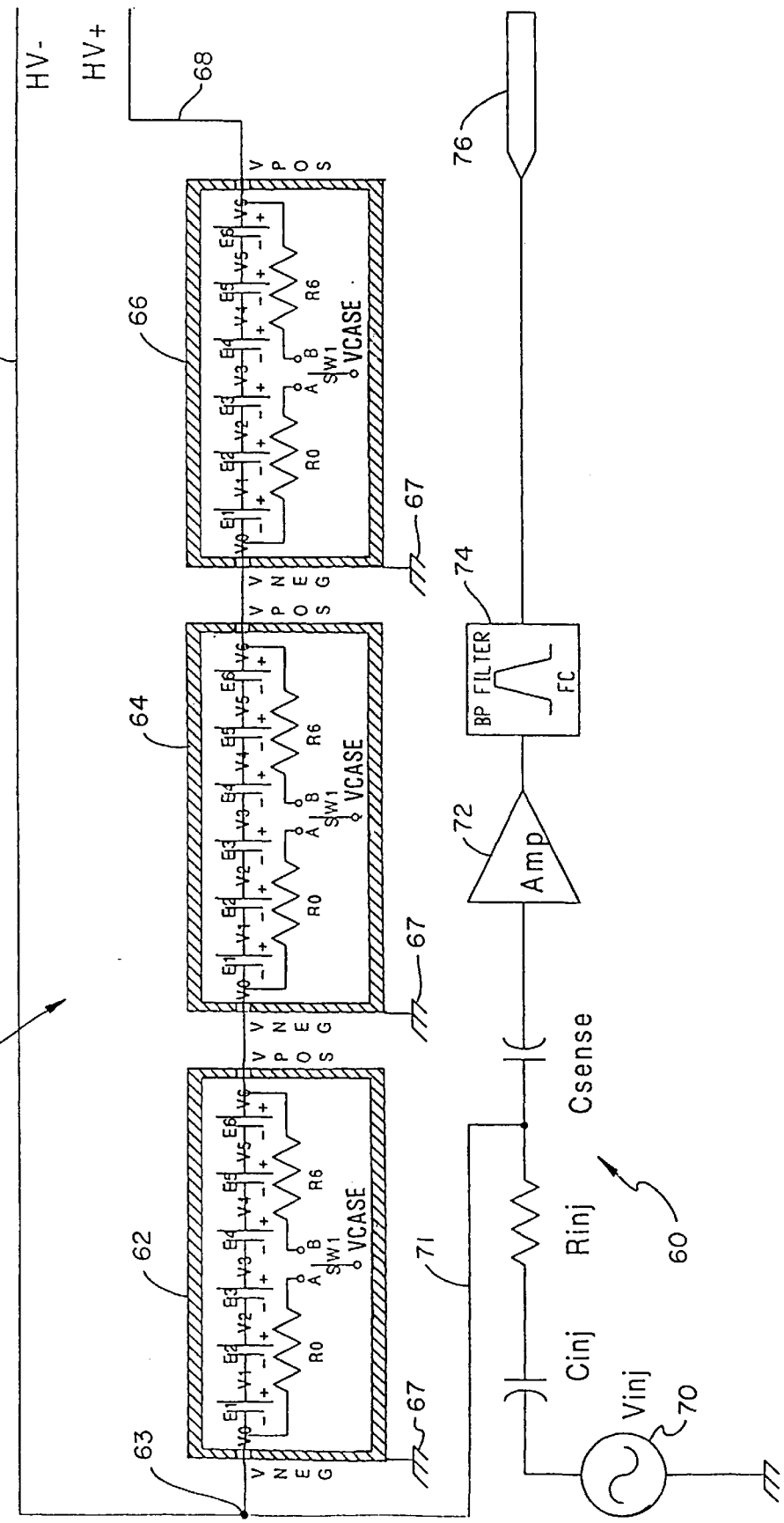
FIGS. 12–15 depict an embodiment of an apparatus for detecting an internal short in an encased energy storing device using an alternating current (AC) approach.

In accordance with another embodiment of the present invention, a circuit that implements an alternating current (AC) fault detection methodology is employed to detect the presence of a partial fault condition occurring within a string of series connected or parallel connected encased energy storing systems. This approach may be of particular use when the conducting enclosures are required to be grounded. In the embodiment depicted in FIG. 12, a partial fault detection circuit 60 generates a test signal which is injected into a series power connection 68 to which a number an energy storing systems 62, 64, 66 are connected. Although the three energy storing systems 62, 64, 66 are shown as being connected in series with the power line 68, it is understood that any number of energy storing systems, each having an embedded detection circuit 60, may each be connected in a series or parallel relationship with respect to the power line 68 and other energy storing systems coupled to the power line 68. The energy storing systems 62, 64, 66, which constitute a battery in this illustrative embodiment, may each include a number of individual energy storing devices connected in series with the series power connection 68. In one embodiment, each of the energy storing systems 62, 64, 66 includes an internal fault detection circuit substantially equivalent to that described previously with regard to FIGS. 2–11.

The partial fault detection circuit 60 is coupled to the series connection 68 by line 71. In one embodiment, a signal generator 70 produces a test signal, $V_{inj}$, having a pronounced frequency component, $f_c$, which is injected through a capacitor, $C_{inj}$, and a resistor, $R_{inj}$, into the series power line 68 at a connection 63 adjacent the first energy storing system 62. In the absence of a breach in any of the energy storing systems 62, 64, 66, and assuming that the ground of the battery 61 floats with respect to a chassis (not shown) that supports the battery 61, the battery acts as a waveguide for transmitting the AC test signal, $V_{inj}$, which may be a sine wave, through the battery circuit. The test signal is passed through the capacitor $C_{sense}$, where it is amplified by an amplifier 72. The output signal from the amplifier 72 is transmitted to a detector 74 which, in one embodiment, includes a bandpass filter having center frequency of $f_c$. The passband of the bandpass filter may be selected to filter out noise and extraneous signal content and harmonics so that the test signal, $V_{inj}$, can be reliably detected if present at the output of the amplifier 72. The output of the detector 74 may be coupled to an external circuit or device, such as a microprocessor or controller, at an output contact 76.

Figure 13:
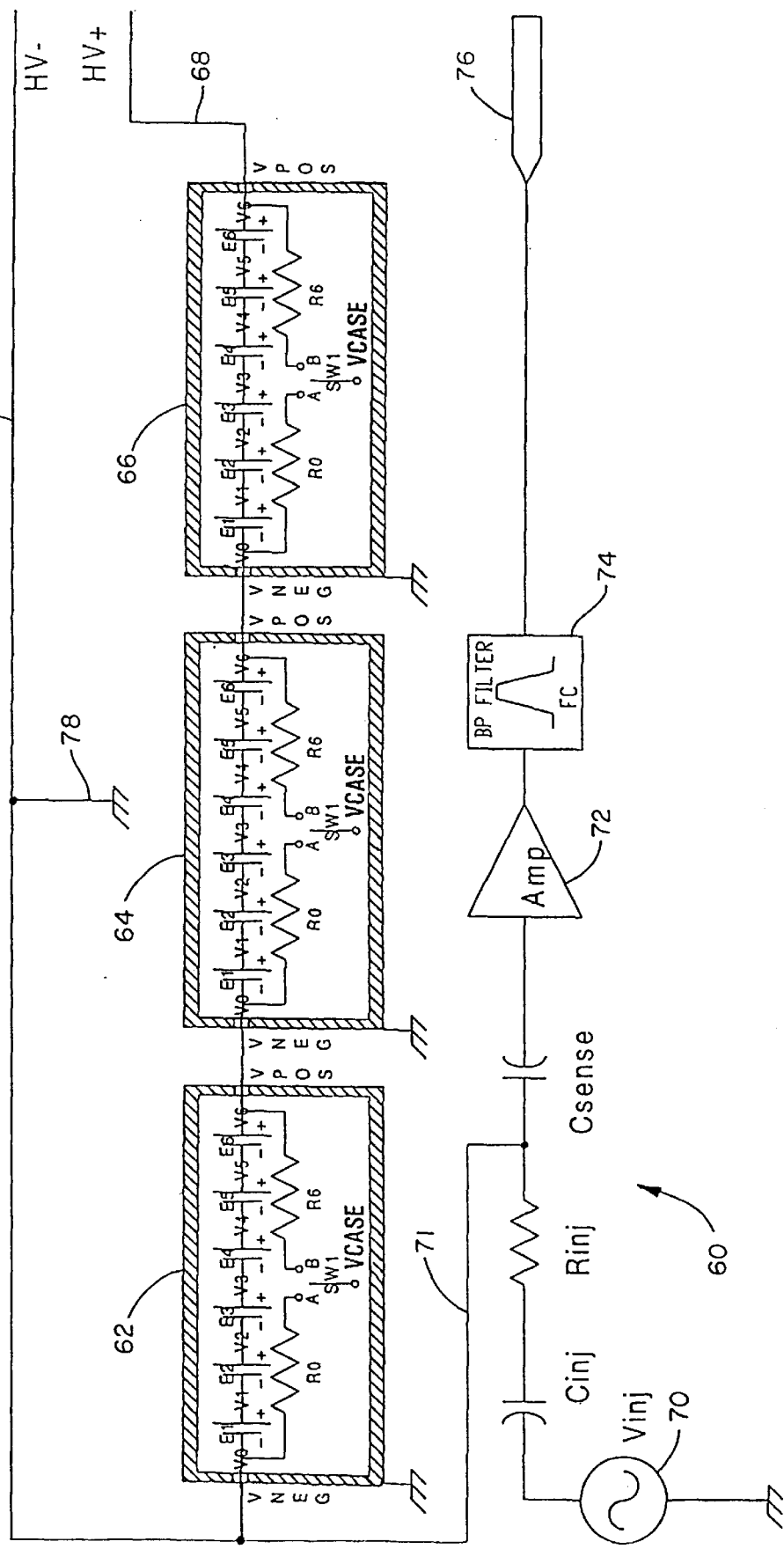

Upon the development of a short-circuit condition in one of the energy storing systems 62, 64, 66, which is depicted in FIG. 13 by the negative high voltage line 68 being grounded 78 to the chassis, the test signal, $V_{inj}$, will be directed to chassis ground 78. As such, no appreciable signal will be present at the input of the amplifier 72, and, therefore, no test signal is present at the input of the detector 74 or at the output contact 76. In this illustrative embodiment, the values of the components shown as constituting the AC partial fault detection circuit 60 are given as: $V_{inj}=1V$; $R_{inj}=1\ K\Omega$; $C_{inj}=0.1\ \mu F$; $C_{sense}=0.1\ \mu F$; $f_c=10$ KHz; passband 50 Hz; and amplifier gain=10. It is noted that there is no appreciable change in the output potential of the battery 61, which is defined as the difference between the potentials HV+ and HV−, resulting from the partial fault condition. The AC circuit 60 provides for the detection of undesirable partial faults that can adversely affect the performance of a battery over time which would remain undetected by employment of a conventional external potential measuring approach.

Figure 14:
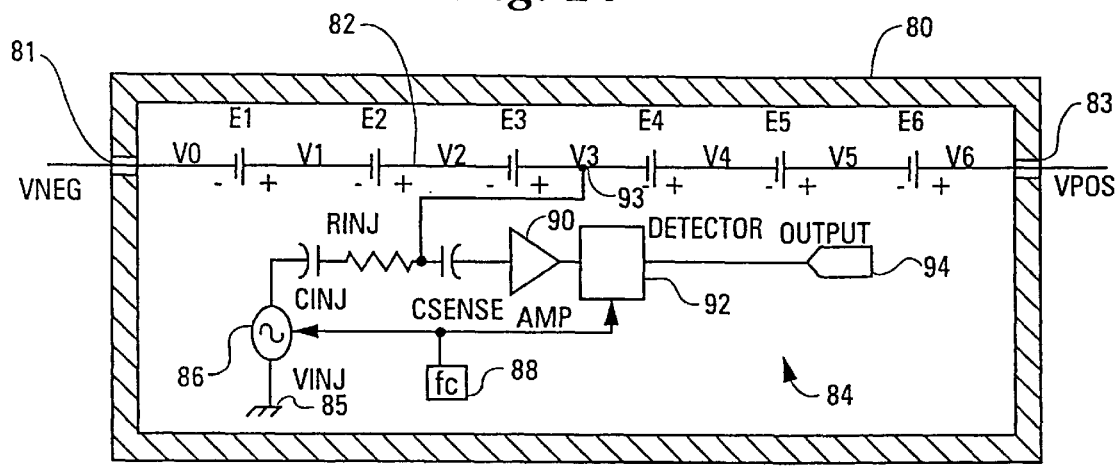
Figure 15:
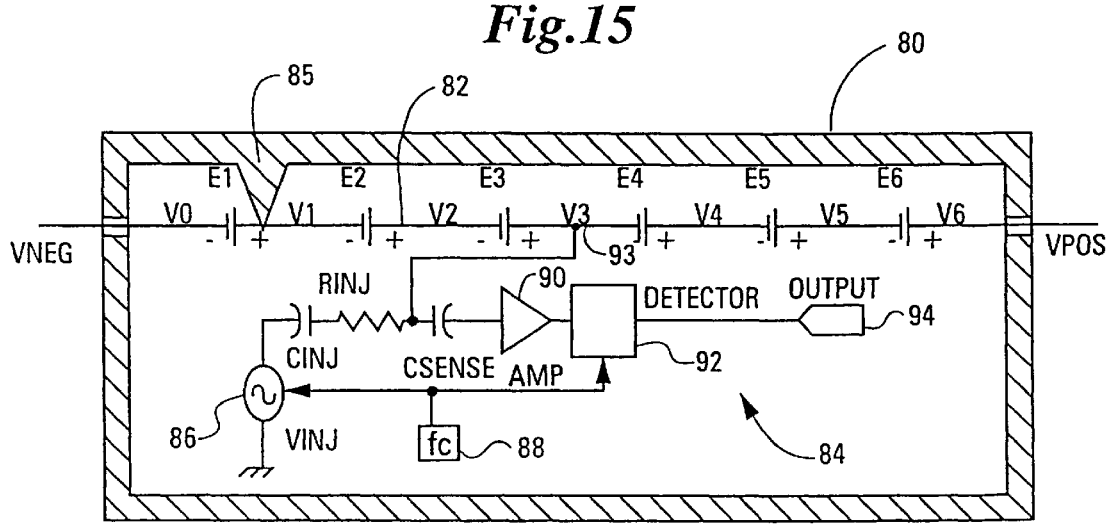

Turning now to FIGS. 14–15, there is illustrated another embodiment of an AC partial fault detection circuit 84 in which a detector 92 is coupled to a frequency generator 88 which determines the frequency of the test signal, $V_{inj}$, produced by the signal generator 86. Because the detector is coupled directly to the frequency generator 88, a more enhanced detection capability may be realized when detecting partial faults for a number of energy storing systems connected in series or parallel, such as the six series connected energy storing systems shown in FIGS. 12–13. Various known synchronous detection techniques, such as those that employ a lock-in amplifier for example, may be used to precisely identify which one of several energy storing systems has been subject to a partial fault condition.

In one embodiment, an AC test signal having a unique frequency, frequency band, or other characteristic is associated with a particular energy storing system within the grouping of energy storing systems. Detecting the presence or absence of the unique AC signal indicates the presence or absence of a partial fault in the particular energy storing system. In another embodiment, the frequency generator 88 may be employed to modulate the excitation and detection test signals such that the test signal for a particular energy storing system is distinguishable from the test signals associated with other energy storing systems connected to the power line 82.

In the embodiment shown in FIG. 14, an energy storing system 80 includes six energy storing devices, $E_1$ through $E_6$, which are connected in series respectively to negative and positive floating terminals 81, 83. A test signal, $V_{inj}$, is injected into the power line 82 at a junction 93 on the power line 82 situated toward the middle portion of the series string 82 of energy storing devices. In this illustrative example, the test signal, $V_{inj}$, is injected at a junction 93 between energy storing device $E_3$ and energy storing device $E_4$. It is noted that the ground 85 for the fault detection circuit 84 is local to the energy storing system 80.

In the absence of a short-circuit condition occurring as a result of a breach in an insulating layer between the energy storing devices and the housing 80, the test signal, $V_{inj}$, injected at the junction 93 has a potential of $V_3$. The test signal, $V_{inj}$, may be attenuated as the test signal travels through the power line 82 due to, for example, parasitic and discrete capacitances, inductances or chokes. This attenuation, however, should be relatively minimal and as such, accurate local detection of a short-circuit condition within the energy storing system should be obtainable.

If a partial fault occurs at a junction between the negative terminal 81 and first energy storing device $E_1$, as is shown in FIG. 15, the test signal, $V_{inj}$, will be brought to the potential of the housing 80. If the housing 80 is tied to the local ground, then the test signal, $V_{inj}$, present at the output of the amplifier 90 will be substantially 0 V. This approach permits early detection of a short-circuit condition occurring in one of a number of power supply modules. By judiciously selecting the values of a series choke or capacitor at the points where the test signal, $V_{inj}$, passes through the housing 80, the particular energy storing system experiencing a short-circuit condition may be accurately determined by determining the unique frequency or characteristic of the test signal, $V_{INJ}$.

Figure 16:
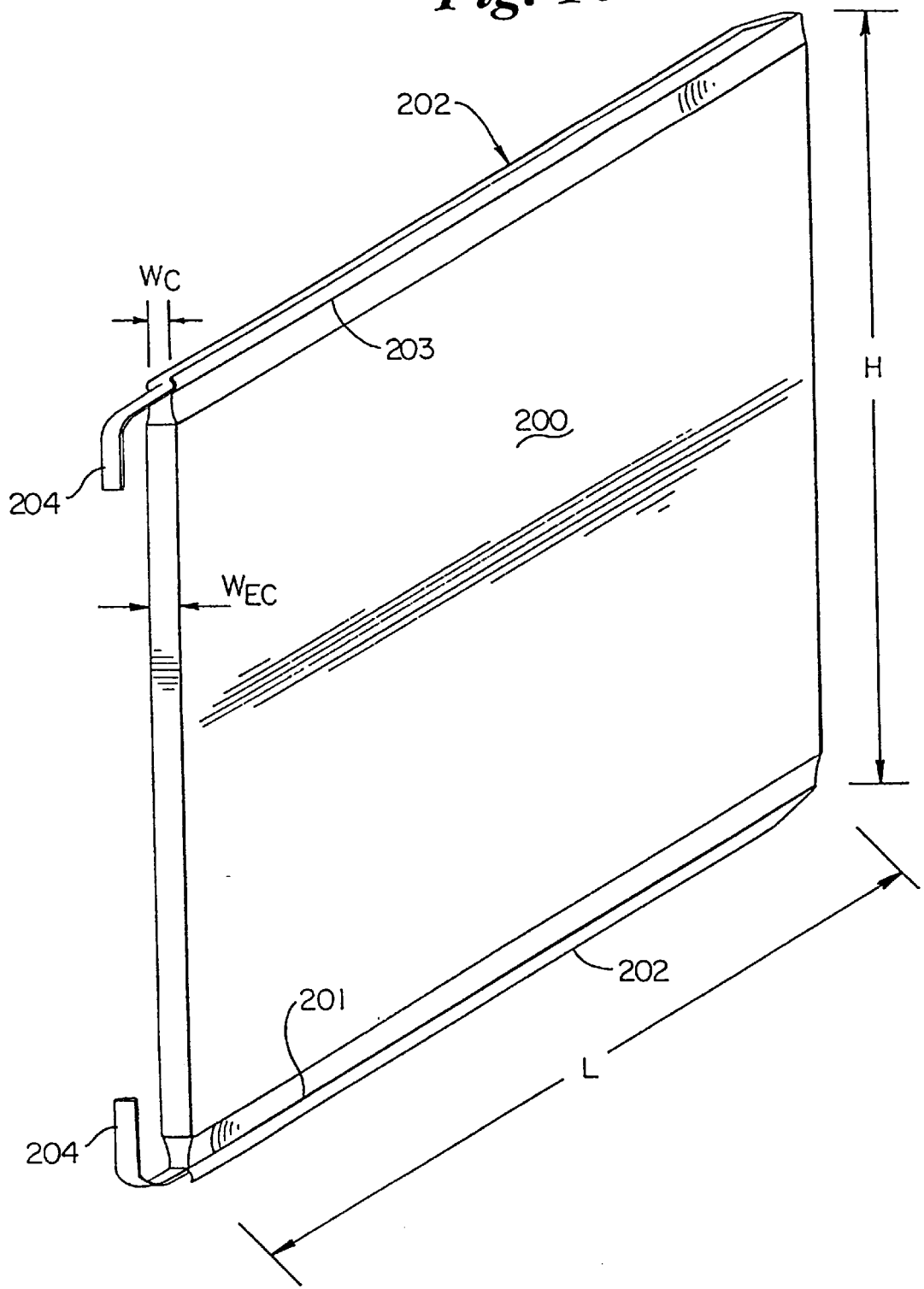
FIG. 16 is an illustration of a prismatic electrochemical cell which represents one embodiment of an energy storing device which may be encased in a protective enclosure.
Figure 17:
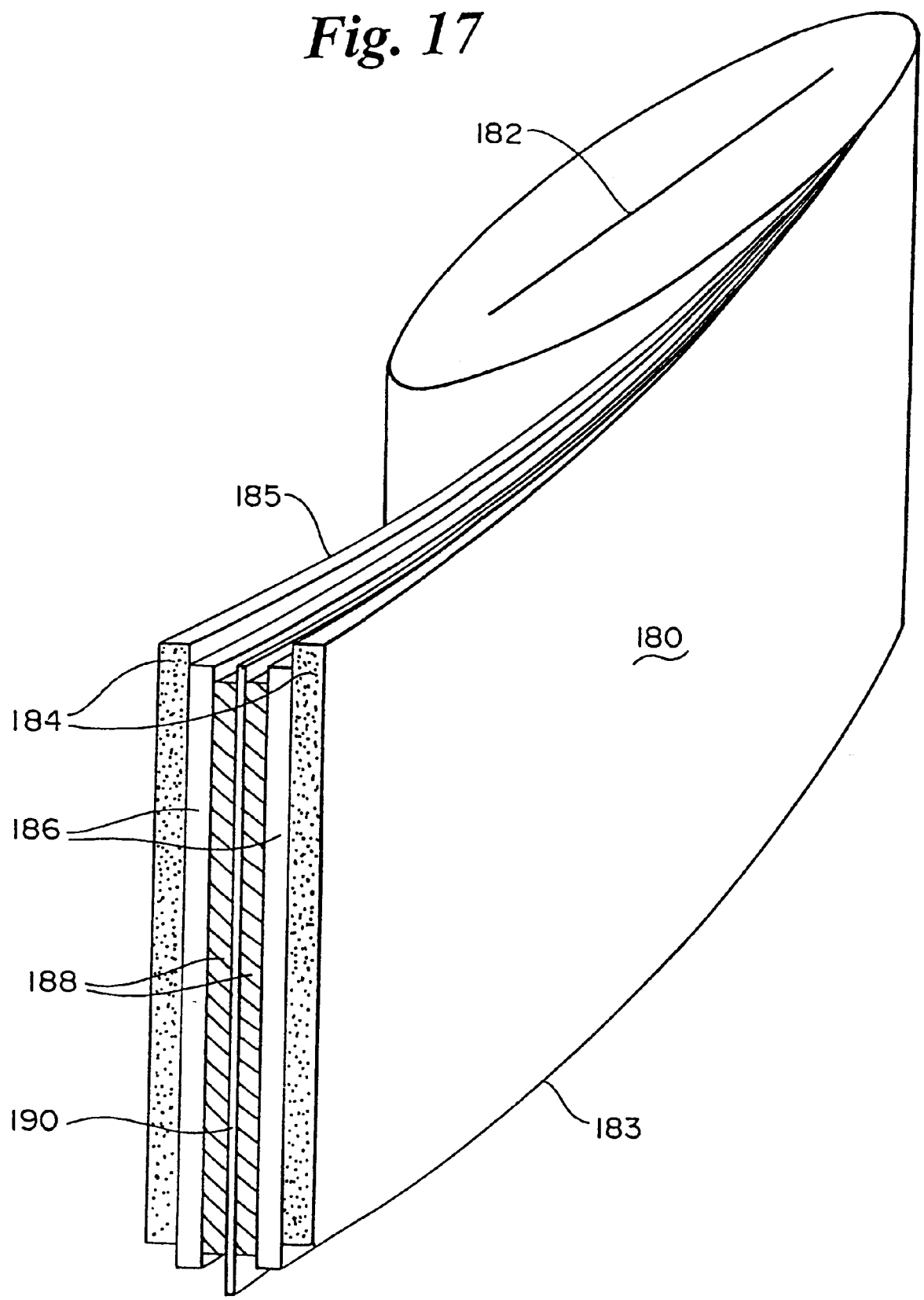
FIG. 17 is a depiction of various film layers constituting an electrochemical cell in accordance with the embodiment shown in FIG. 16.

In accordance with one embodiment of the present invention, the energy storing devices shown in FIGS. 1–15 may constitute solid-state, thin-film cells of the type shown in FIGS. 16–17. Such thin-film electrochemical cells are particularly well-suited for use in the construction of high-current, high-voltage power generating modules and batteries, such as those used to power electric vehicles for example. In FIG. 16, there is shown an embodiment of a prismatic electrochemical cell 200 which includes an anode contact 201 and a cathode contact 203 formed respectively along opposing edges of the electrochemical cell 200. A bus bar 202 is spot welded or otherwise attached to each of the anode and cathode contacts 201, 203, respectively. A bus bar 202 is typically disposed along the length of the anode contact 201 and the cathode contact 203, and typically includes an electrical connection lead 204 for conducting current into and out of the electrochemical cell 200.

The bus bar 202, in one embodiment, also provides a thermal flux path for efficiently transferring thermal energy between the cell 200 and a thermally conductive, electrically resistive material or structure disposed adjacent the cell 200. Further, the bus bar 202 is configured so as to exhibit a spring-like character which provides for substantially continuous contact between the cell 200 and a structure, such as a metallic planar surface, disposed adjacent the cell 200 in response to relative movement between the cell 200 and the adjacent structure. The bus bar 202 may be fashioned from copper and have a substantially C-shaped, double C-shaped, Z-shaped, V-shaped, or O-shaped cross-section.

Figure 18:
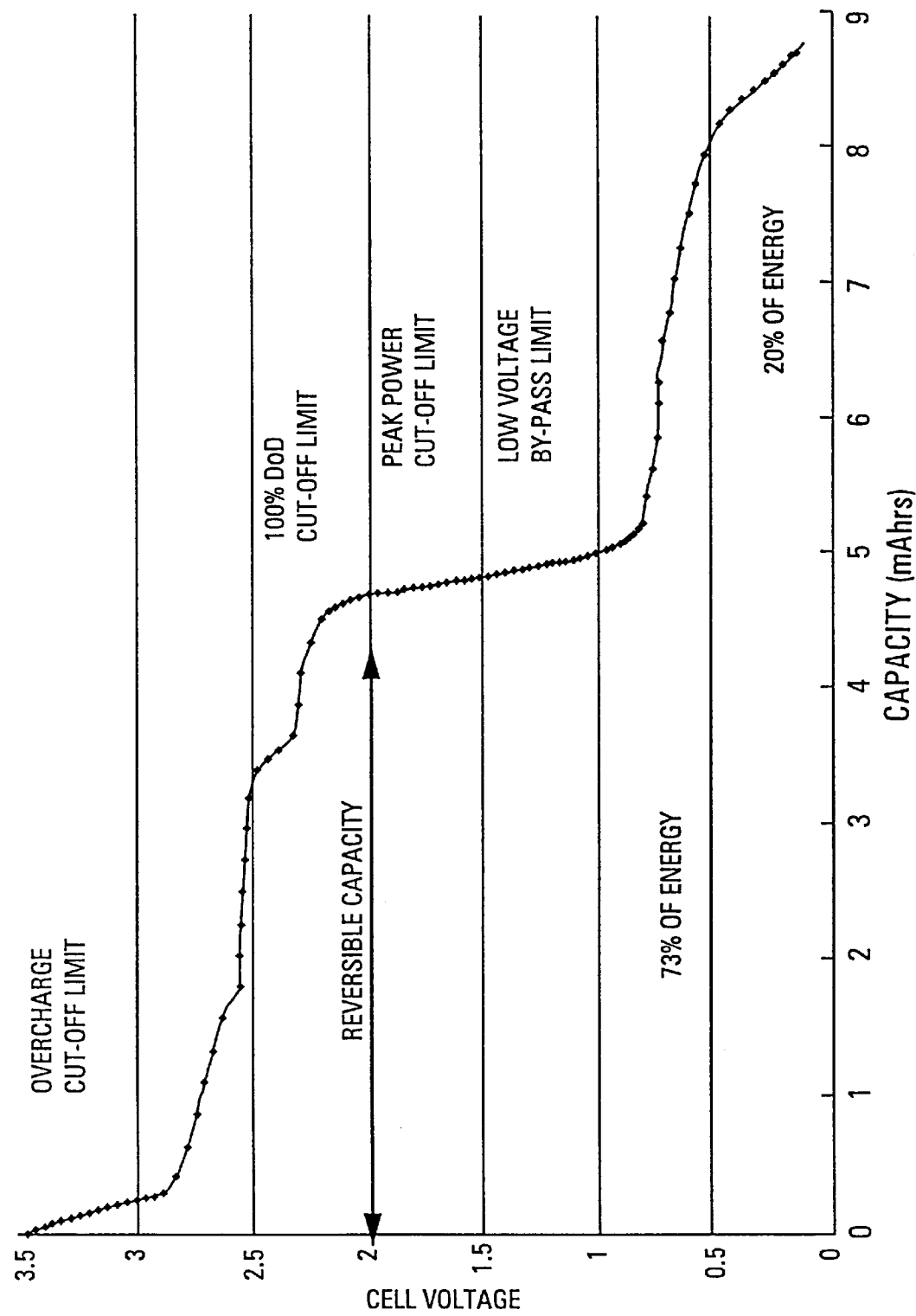
FIG. 18 illustrates in graphical form a relationship between voltage and capacity of a solid-state, thin-film cell having a construction similar to that shown in FIGS. 16–17.

In this embodiment, the electrochemical cell 200 is fabricated to have a length L of approximately 135 mm, a height H of approximately 149 mm, and a width $W_{ec}$ of approximately 5.4 mm or approximately 5.86 mm when including a foam core element. The width $W_c$ of the cathode contact 203 and the anode contact 201 is approximately 3.9 mm, respectively. Such a cell 200 typically exhibits a nominal energy rating of approximately 36.5 Wh, a peak power rating of 87.0 W at 80 percent depth of discharge (DOD), and a cell capacity of 14.4 Ah at full charge. FIG. 18 illustrates in graphical form a relationship between voltage and capacity for an electrochemical cell having a construction substantially similar to that illustrated in FIGS. 16–17. It can be seen that an individual electrochemical cell has a nominal operating voltage ranging between approximately 2.0 V and 3.1 V.

The electrochemical cell shown in FIG. 16 may have a construction similar to that illustrated in FIG. 17. In this embodiment, an electrochemical cell 180 is shown as having a flat wound prismatic configuration which incorporates a solid polymer electrolyte 186 constituting an ion transporting membrane, a lithium metal anode 184, a vanadium oxide cathode 188, and a central current collector 190. These film elements are fabricated to form a thin-film laminated prismatic structure, which may also include an insulation film, such as polypropylene film.

A known sputtering metallization process is employed to form current collecting contacts along the edges 185, 183 of the anode and cathode current collector films 184, 190, respectively. It is noted that the metal-sprayed contacts provide for superior current collection along the length of the anode and cathode film edges 185, 183, and demonstrate good electrical contact and heat transfer characteristics. A spring-like thermal conductor or bus bar, such as the bus bar 202 shown in FIG. 16, is then spot-welded or otherwise attached to the metal-sprayed contact. The electrochemical cells illustrated in FIGS. 16–17 may be fabricated in accordance with the methodologies disclosed in U.S. Pat. Nos. 5,423,110, 5,415,954, and 4,897,917.

A number of electrochemical cells may be selectively interconnected in a parallel and/or series relationship to achieve a desired voltage and current rating. For example, and with reference to FIGS. 19–20, a number of individual electrochemical cells 210 may be grouped together and connected in parallel to common positive and negative power buses or lines to form an energy storing device termed a cell pack 212. A number of the electrochemical cell packs 212 may then be connected in series to form an energy storing devices termed a module 214. Further, a number of individual modules 214 may be connected in series to constitute a battery 216.

Figure 19:
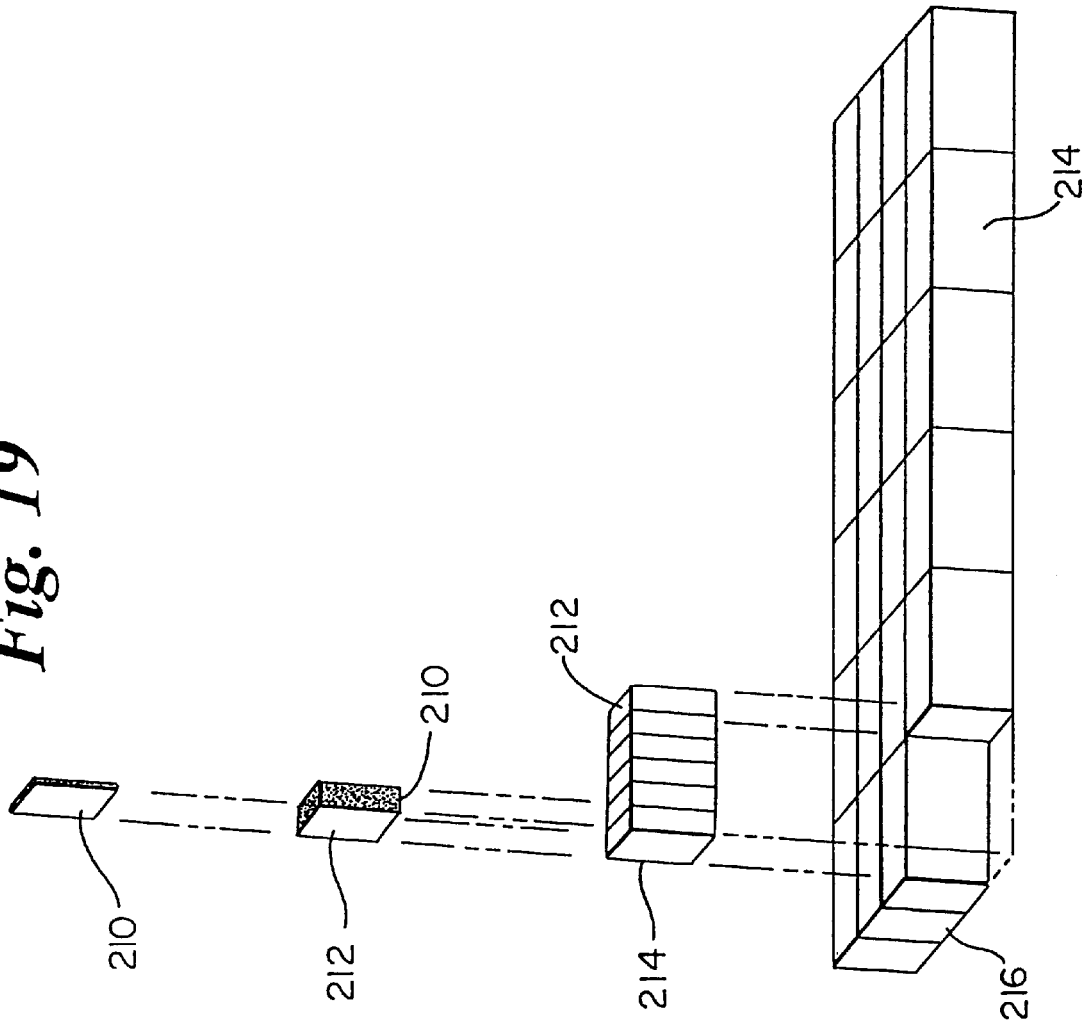
FIG. 19 illustrates various packaging configurations of an energy storing device, including cell pack, module, and battery configurations.
Figure 20:
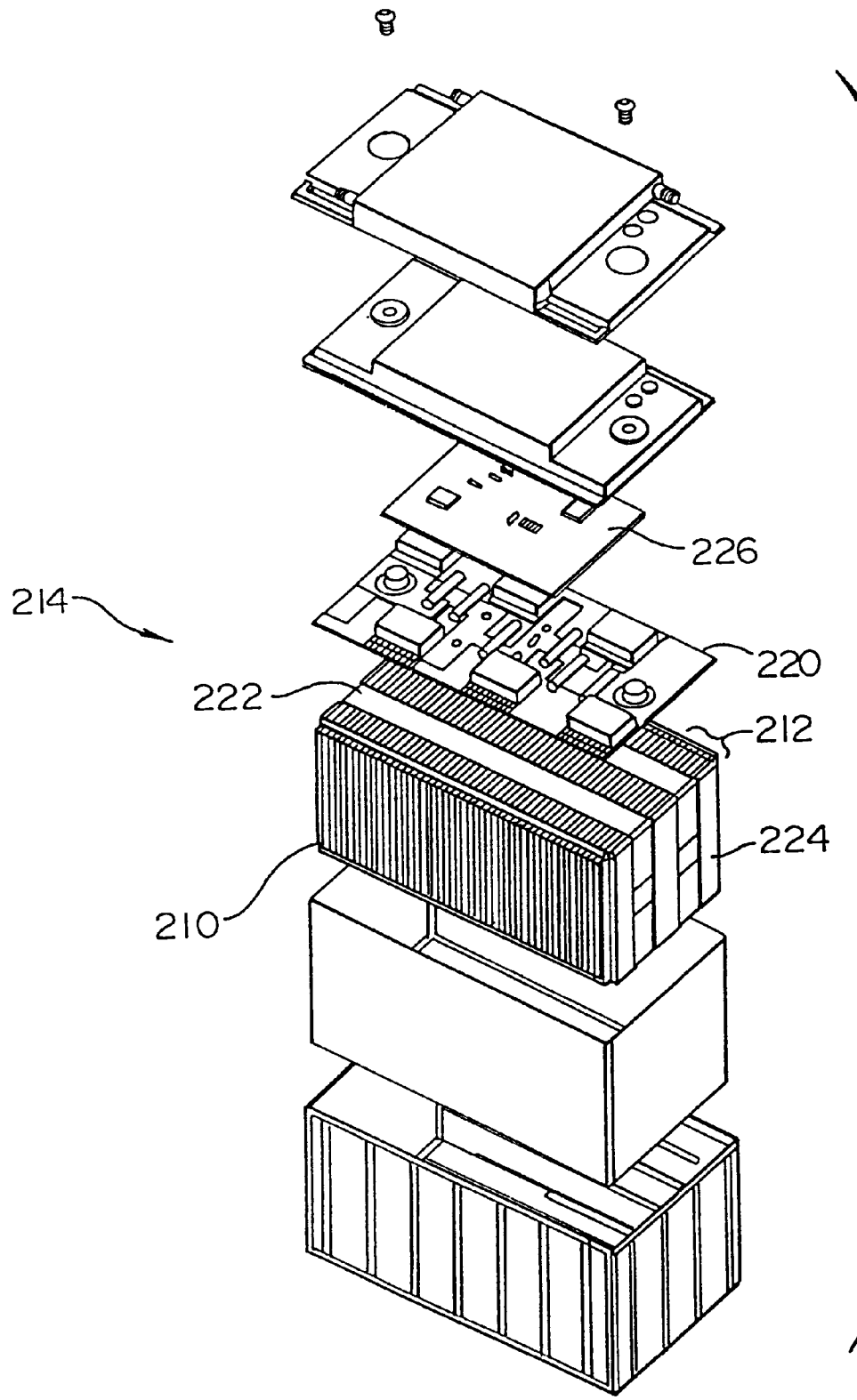
FIG. 20 is an exploded view of a power generating module in accordance with an embodiment of the present invention.

The embodiments shown in FIGS. 19–20 depict an arrangement of electrochemical cells 210 in accordance with a modular packaging approach which provides an efficient means of achieving desired power requirements for a broad range of high-power applications. In this illustrative embodiment, eight electrochemical cells 210 are grouped together and connected in parallel to form a cell pack 212. A module 214 is constituted by grouping six cell packs 212 together and connecting the packs 212 in series. A battery 216 is shown as constituting 24 modules 214 connected in series.

Given these arrangements, and assuming that each of the electrochemical cells 210 has dimensions and characteristics equivalent to those depicted in FIGS. 16–18, each individual cell 210 provides for a total energy output of approximately 36.5 Wh. Each cell pack 212 provides for a total energy output of approximately 292 Wh, while each module 214 provides for a total energy output of 1.75 kWh. The battery 216, constituted by an array of four axially and six longitudinally oriented modules 214 connected in series as is shown in the embodiment of FIG. 19, provides for a total energy output of approximately 42 kWh. In this configuration, the battery 216 generate a peak operating current on the order of approximately 400 A. It is understood that the arrangement of electrochemical cells 210 and interconnection of cells 210 forming a cell pack 212, module 214, and battery 216 may vary from the arrangements depicted in FIGS. 19–20.

In FIG. 20, there is shown an exploded view of an embodiment of an energy storage module 214 which houses a number of electrochemical cells 210, interconnection hardware, and control/monitoring hardware and software. In accordance with one embodiment, the module 214 includes a stack of 48 electrochemical cells 210 which are interconnected through use of a power board 220. The stack of electrochemical cells 210 are segregated into six cell packs 212, all of which are banded together by use of two bands 222 and two opposing thrust plates 224.

The 48 electrochemical cells 210 are subjected to continuous compressive forces generated by use of the bands 222/thrust plates 224 and a foam or spring-type element disposed in each of the cells 210 and/or between all or selected ones of the cells 210. It is noted that the foam or spring-type core element provided in the center of each of the cells 210 serves to distribute pressure evenly between the cells 210, which is of particular importance as cell volumes change during charge and discharge cycling. Partial fault detection circuitry is typically provided on the power board 220, but may also by disposed on a control board 226 or other internal or external platform that electrically communicates with the string of electrochemical cells 210.

It will, of course, be understood that various modifications and additions can be made to the various embodiments discussed herein above without departing from the scope or spirit of the present invention. By way of example, the partial fault detection methodology disclosed herein may be employed for series or parallel connected energy storing devices of a conventional design, such as wet and dry electrolytic cells, or an advanced design, such as those employing nickel metal hydride (Ni—MH), lithium-ion, (Li—Ion), and other high energy battery technologies. Accordingly, the scope of the present invention should not be limited by the particular embodiments discussed above, but should be defined only by the claims set forth below and equivalents thereof.

What we claim is:

1. An apparatus for detecting a breach in an electrically insulating surface of an electrically conductive power system enclosure, comprising:

a plurality of series connected energy storing devices each coupled to a series connection and disposed in the enclosure; and a detector coupled to the series connection that detects a change of state in a test signal derived from the series connected energy storing devices, the change of state of the test signal from a nominal state to a non-nominal state indicating a development of a short between the series connected energy storing devices and the enclosure.

2. The apparatus of claim 1, wherein the detector further comprises a signal generator that produces the test signal as a modulated test signal and injects the modulated test signal into the series connection, the detector detecting the state change of the modulated test signal from a signal substantially equivalent to the modulated test signal, representative of the nominal state, to an absence of the modulated test signal, representative of the non-nominal state.

3. The apparatus of claim 1, wherein change of state in the test signal is detected relative to a state of the enclosure.

4. The apparatus of claim 1, wherein the detector further comprises:
  a pair of tap lines respectively coupled to adjacent opposing end energy storing devices of the series connected energy storing devices;
  a switch that selectively couples each of the tap lines to the enclosure to respectively develop the test signal on each of the tap lines; and
  a voltage detector, coupled to the switch, that detects the state change of the test signal from a voltage of a selected end energy storing device, representative of the nominal state, to a voltage that substantially exceeds the voltage of the selected opposing end energy storing device, representative of the non-nominal state.

5. The apparatus of claim 4, wherein one of the tap lines is coupled to a positive most terminal of the enclosure and the other one of the tap lines is coupled to a negative most terminal of the enclosure.

6. The apparatus of claim 1, wherein the detector further comprises a signal generator that produces the test signal as a time-varying test signal and injects the time-varying test signal into the series connection, the detector detecting the state change of the time-varying test signal from a signal substantially equivalent to the time-varying test signal, representative of the nominal state, to an absence of the time-varying test signal, representative of the non-nominal state.

7. The apparatus of claim 6, wherein the time-varying test signal has a frequency on the order of 10 KHz.

8. The apparatus of claim 1, further comprising a controller that cooperates with the detector to detect the change of state in a test signal selectively derived from each of the series connected energy storing devices.

9. The apparatus of claim 8, wherein the controller is disposed internally within the enclosure or disposed external to the enclosure.

10. The apparatus of claim 1, further comprising:
  a first terminal and a second terminal provided on the enclosure;
  a first tap line resistively coupled to a first energy storing device of the series connected energy storing devices adjacent the first terminal;
  a second tap line resistively coupled to a last energy storing device of the series connected energy storing devices adjacent the second terminal; and
  a switch coupled to the enclosure and operable between first, second, and neutral states, the switch coupling the first tap line with the enclosure when operated in the first state and coupling the second tap line with the enclosure when operated in the second state;
  wherein the detector detects a voltage of a first test signal developed on the first tap line when the switch is operated in the first state and detects a voltage of a second test signal developed on the second tap line when the switch is operated in the second state, whereby the breach in the electrically insulating surface is indicated by the first or second test signal voltages exceeding voltages of the first or last energy storing devices, respectively.

11. The apparatus of claim 10, wherein a breach in the electrically insulating surface developed at a junction on the series connection between the first energy storing device and the first terminal is detected by the detector as a voltage of the second test signal developed on the second tap line exceeding the voltage of the last energy storing device.

12. The apparatus of claim 10, wherein a breach in the electrically insulating surface developing at a junction on the series connection between the last energy storing device and the second terminal is detected by the detector as a voltage of the first test signal developed on the first tap line exceeding the voltage of the first energy storing device.

13. The apparatus of claim 10, wherein the detector is substantially non-interactive with the series connected energy storing devices when the switch is operated in the neutral state.

14. The apparatus of claim 10, wherein the first and second test signal voltages are detected relative to a potential of the enclosure.

15. The apparatus of claim 10, further comprising a controller coupled to the switch that controls the state of the switch between the first, second, and neutral states.

16. The apparatus of claim 15, wherein the controller is disposed internally within the enclosure or disposed external to the enclosure.

17. An apparatus for detecting a breach in an electrically insulating surface of an electrically conductive power system enclosure, comprising:
  a plurality of series connected energy storing devices each coupled to a series connection and disposed in the enclosure; and
  a detector comprising a signal generator that produces a test signal as a time-varying test signal and injects the time-varying test signal into the series connection, the detector detecting a state change of the time-varying test signal from a signal substantially equivalent to the time-varying test signal, representative of a nominal state, to an absence of the time-varying test signal, representative of a non-nominal state.

18. The apparatus of claim 17, wherein the time-varying test signal has a frequency on the order of 10 KHz.

19. The apparatus of claim 17, wherein the time-varying test signal has an amplitude of about 5 volts peak-to-peak.

20. An apparatus for detecting a breach in an electrically insulating surface of an electrically conductive power system enclosure, comprising:
  a plurality of series connected energy storing devices each coupled to a series connection and disposed in the enclosure; and
  a detector comprising a signal generator that produces a modulated test signal and injects the modulated test signal into the series connection, the detector detecting a state change of the modulated test signal from a signal substantially equivalent to the modulated test signal, representative of a nominal state, to an absence of the modulated test signal, representative of a non-nominal state.

* * * * *

UNITED STATES PATENT AND TRADEMARK OFFICE
CERTIFICATE OF CORRECTION

PATENT NO. : 6,100,702
DATED : August 8, 2000
INVENTOR(S) : Hagen et al.

It is certified that error appears in the above-identified patent and that said Letters Patent is hereby corrected as shown below:

<u>Title page,</u>
Item [56], References Cited, U.S PATENT DOCUMENTS, please replace "5,647,531" with -- 5,647,534 --.

<u>Column 9,</u>
Line 27, please replace "$V_{inj} = = 1V$" with -- $V_{inj} = 1V$ --.

Signed and Sealed this

Seventh Day of May, 2002

Attest:

JAMES E. ROGAN
Attesting Officer     *Director of the United States Patent and Trademark Office*